(12) United States Patent
Konoshima et al.

(10) Patent No.: US 10,788,750 B2
(45) Date of Patent: Sep. 29, 2020

(54) PHOTOSENSITIVE RESIN COMPOSITION, CURED FILM, LAMINATE, TOUCH PANEL MEMBER, AND METHOD FOR MANUFACTURING CURED FILM

(71) Applicant: TORAY INDUSTRIES, INC., Tokyo (JP)

(72) Inventors: Yohei Konoshima, Otsu (JP); Mitsuhito Suwa, Otsu (JP); Chika Hibino, Otsu (JP); Yuka Yamashiki, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 135 days.

(21) Appl. No.: 16/078,432

(22) PCT Filed: Mar. 9, 2017

(86) PCT No.: PCT/JP2017/009557
§ 371 (c)(1),
(2) Date: Aug. 21, 2018

(87) PCT Pub. No.: WO2017/159543
PCT Pub. Date: Sep. 21, 2017

(65) Prior Publication Data
US 2019/0049840 A1    Feb. 14, 2019

(30) Foreign Application Priority Data

Mar. 15, 2016 (JP) ................. 2016-050622

(51) Int. Cl.
| | | |
|---|---|---|
| G03F 7/033 | (2006.01) | |
| G06F 3/044 | (2006.01) | |
| G03F 7/038 | (2006.01) | |
| G03F 7/031 | (2006.01) | |

(52) U.S. Cl.
CPC .............. *G03F 7/033* (2013.01); *G03F 7/031* (2013.01); *G03F 7/038* (2013.01); *G03F 7/0388* (2013.01); *G06F 3/044* (2013.01); *G06F 2203/04103* (2013.01)

(58) Field of Classification Search
CPC .......... G03F 7/033; G03F 7/038; G03F 7/031; G06F 3/044; G06F 2203/04103
USPC ........................................................ 428/522
See application file for complete search history.

(56) References Cited

U.S. PATENT DOCUMENTS

2007/0154820 A1* 7/2007 Kang ................... G03F 7/0007
430/7
2013/0317157 A1* 11/2013 Sengoku ................ C08K 5/098
524/356
2015/0378258 A1* 12/2015 Araki ..................... G06F 3/041
430/18
2017/0038682 A1    2/2017 Suwa et al.
2018/0174701 A1    6/2018 Kushida et al.

FOREIGN PATENT DOCUMENTS

| | | | |
|---|---|---|---|
| JP | 2008-122806 A | 5/2008 | |
| JP | 2008122806 A * | 5/2008 | |
| JP | 2010-152302 A | 7/2010 | |
| JP | 2012-163735 A | 8/2012 | |
| JP | 2013-76821 A | 4/2013 | |
| JP | 2013-174643 A | 9/2013 | |
| JP | 2013174643 A * | 9/2013 | ............ G03F 7/027 |
| JP | 2014-2375 A | 1/2014 | |
| JP | 2014-215954 A | 11/2014 | |
| JP | 2015-60091 A | 3/2015 | |
| JP | 2015-189947 A | 11/2015 | |
| JP | 2015-193758 A | 11/2015 | |
| JP | 2015189947   * | 11/2015 | |
| JP | 2015193758   * | 11/2015 | |
| KR | 10-2009-0062898 A | 6/2009 | |
| WO | WO 2015/159655 A1 | 10/2015 | |
| WO | WO 2017/010534 A1 | 1/2017 | |

OTHER PUBLICATIONS

Translation of JP 2013-174643 (application 2012-037533), Sep. 5, 2013. (Year: 2013).*
Translation of JP 2015-189947 (application 2014-070353), Nov. 2, 2015. (Year: 2015).*
Translation of JP 2008-122806 (application 2006-308398), May 29, 2008. (Year: 2008).*
Translation of JP 2015-193758 (application 2014-073110), Nov. 5, 2015. (Year: 2015).*
International Search Report, issued in PCT/JP2017/009557, PCT/ISA/210, dated May 16, 2017.
Written Opinion of the International Searching Authority, issued in PCT/JP2017/009557, PCT/ISA/237, dated May 16, 2017.

* cited by examiner

*Primary Examiner* — Hui H Chin
(74) *Attorney, Agent, or Firm* — Birch, Stewart, Kolasch & Birch, LLP

(57) ABSTRACT

An object of the present invention is to provide a transparent photosensitive material that is usable as an interlayer insulating film for metal wires, is excellent in migration resistance and substrate adhesiveness under high temperature and high humidity conditions, and is satisfactory in patternability. The photosensitive resin composition of the present invention contains an acrylic polymer (A1) having, in a side chain thereof, a polymerizable group, a cardo based resin (A2) having a polymerizable group and an alkali-soluble group, and a photopolymerization initiator (B), and contents of the acrylic polymer (A1) and the cardo based resin (A2) satisfy a weight ratio of 1:10 to 10:1.

18 Claims, 1 Drawing Sheet

PHOTOSENSITIVE RESIN COMPOSITION, CURED FILM, LAMINATE, TOUCH PANEL MEMBER, AND METHOD FOR MANUFACTURING CURED FILM

TECHNICAL FIELD

The present invention relates to a photosensitive resin composition, a cured film, a laminate, a touch panel member, and a method for manufacturing a cured film.

BACKGROUND ART

At present, capacitive touch panels are used in many of smartphones and tablet terminals. In general, sensor substrates of capacitive touch panels have a structure that includes a glass substrate and wires produced by patterning with indium tin oxide (ITO) or a metal (such as silver, molybdenum, or aluminum) on the glass substrate, and also includes an insulating film, and a protective film for protecting ITO and metals at an intersection between the wires. In general, protective films are formed from hard inorganic materials such as $SiO_2$ and $SiN_x$ or a transparent photosensitive material, and insulating films are formed from a transparent photosensitive material in many cases. The inorganic materials, however, have problems that they require film formation at high temperatures and patterning by photolithography, so that a large number of processes are required and the manufacturing cost is high. Although transparent photosensitive materials are expected to reduce the cost due to a decrease in the number of processes, the transparent photosensitive materials have problems that outgassing occurs in later steps and the resistance value of the wire portion rises when a similar transparent photosensitive material is used as an insulating film. Further, from the viewpoint of increasing the sensitivity with the increase in size of touch panels, methods of forming the wire portion with a metal have been developed (see, for example, Patent Documents 1, 2, and 3). Since multilayer metal wires tend to suffer from a migration phenomenon in which metal ions migrate in an insulating material provided between layers under high temperature and high humidity conditions and easily cause short circuit, high moisture and heat resistance is required of insulating materials. Conventional inorganic materials and transparent photosensitive materials, however, lack resistance to migration because they are poor in moisture and heat resistance, and it has been impossible to produce a highly reliable touch panel.

As a transparent photosensitive material, a UV-curable coating composition containing an alkali-soluble polymer, a monomer, a photopolymerization initiator, and other additives is known. Such a composition is used not only in overcoat materials for color filters and spacer materials but also in color resists further containing a coloring agent (see, for example, Patent Document 4).

As a technique for improving the properties of these compositions, a polyfunctional epoxy compound and a maleimide compound are studied in Patent Documents 5 and 6, respectively. These documents suggest improvement in substrate adhesiveness and chemical resistance.

PRIOR ART DOCUMENTS

Patent Documents

Patent Document 1: Japanese Patent Laid-open Publication No. 2016-003343
Patent Document 2: Japanese Patent Laid-open Publication No. 2016-000847
Patent Document 3: International Publication No. 2015/159655
Patent Document 4: Japanese Patent Laid-open Publication No. 2015-75499
Patent Document 5: Japanese Patent Laid-open Publication No. 2013-76821
Patent Document 6: Japanese Patent Laid-open Publication No. 2014-197171

SUMMARY OF THE INVENTION

Problems to be Solved by the Invention

At present, capacitive touch panels are essentially required to be increased in sensitivity, to be thinned, and to be of high definition. In Patent Documents 5 and 6, corrosion resistance and the like of a metal substrate have been studied as an evaluation of moisture and heat resistance, but no evaluation has been made from the viewpoint of migration under high temperature and high humidity conditions. Thus, the compositions of Patent Documents 5 and 6 are not satisfactory in terms of properties.

An object of the present invention is to provide a transparent photosensitive material that is usable as an interlayer insulating film for metal wires, is excellent in migration resistance and substrate adhesiveness under high temperature and high humidity conditions, and is satisfactory in patternability.

Solutions to the Problems

The present inventors have found that the object of the present invention can be achieved by combining an acrylic polymer having, in a side chain thereof, a polymerizable group with a cardo based resin having a polymerizable group and an alkali-soluble group at specific ratio.

That is, the photosensitive resin composition of the present invention contains an acrylic polymer (A1) having, in a side chain thereof, a polymerizable group, a cardo based resin (A2) having a polymerizable group and an alkali-soluble group, and a photopolymerization initiator (B), and contents of the acrylic polymer (A1) and the cardo based resin (A2) satisfy a weight ratio of 1:10 to 10:1.

The cured film of the present invention is a cured product of the photosensitive resin composition.

The touch panel member of the present invention includes the cured film.

The method for manufacturing a cured film of the present invention includes the step of applying the photosensitive resin composition to a base material.

Effects of the Invention

The photosensitive resin composition of the present invention is capable of providing a cured film that is excellent in photosensitivity, is usable as an interlayer insulating film for metal wires, and is satisfactory in migration resistance and substrate adhesiveness under high temperature and high humidity conditions.

EMBODIMENTS OF THE INVENTION

Figure 1:
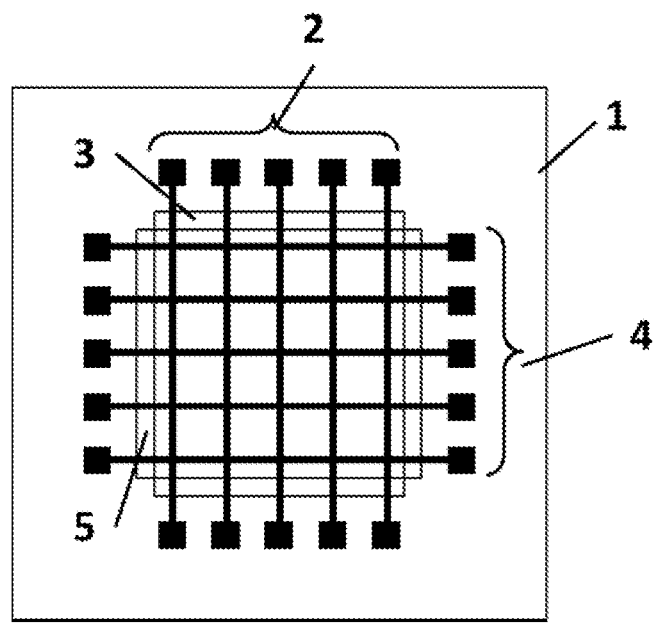
FIG. 1 is a top view showing a configuration of a laminated substrate used for evaluation of migration properties.

The photosensitive resin composition of the present invention contains an acrylic polymer (A1) having, in a side chain thereof, a polymerizable group, a cardo based resin (A2) having a polymerizable group and an alkali-soluble group, and a photopolymerization initiator (B), and contents of the acrylic polymer (A1) and the cardo based resin (A2) satisfy a weight ratio of 1:10 to 10:1, more preferably 1:7 to 8:1.

The photosensitive resin composition of the present invention contains an acrylic polymer (A1) having, in a side chain thereof, a polymerizable group (hereinafter also referred to as an acrylic polymer (A1)) and a cardo based resin (A2) having a polymerizable group and an alkali-soluble group (hereinafter also referred to as a cardo based resin) at a specific ratio. Incorporation of a polymerizable group typified by a (meth)acryloyl group makes the photosensitive resin composition exhibit negative photosensitivity. Incorporation of an alkali-soluble group containing a carboxyl group enables development with an alkali aqueous solution. Preferable examples of the acrylic polymer (A1) and the cardo based resin (A2) are, listed below, but the acrylic polymer (A1) and the cardo based resin (A2) are not limited thereto.

[Acrylic Polymer (A1)]

As the acrylic polymer (A1), for example, an acrylic polymer having an alicyclic skeleton in a side chain thereof can be used. The alicyclic skeleton is a hydrocarbon group not including an aromatic ring structure, and includes a monocyclic alicyclic skeleton or a polycyclic alicyclic skeleton. The alicyclic skeleton may include both a monocyclic alicyclic skeleton and a polycyclic alicyclic skeleton. However, the acrylic polymer does not have to be composed only of an alicyclic skeleton, and may partially include a chain structure. Examples of the group of the monocyclic alicyclic skeleton include a cyclopentyl group and a cyclohexyl group. Examples of the group of the polycyclic alicyclic skeleton include a norbornyl group, an isobornyl group, a tricyclononyl group, a tricyclodecyl group, and a tetracyclododecyl group.

The acrylic polymer (A1) is preferably obtained by radical copolymerization of a carboxyl group- and/or acid anhydride group-containing (meth)acrylic compound and a (meth)acrylic acid ester, and/or maleimide or a maleimide derivative, followed by addition reaction of an ethylenically unsaturated double bond group-containing epoxy compound.

The catalyst for the radical polymerization is not particularly limited, and azo compounds such as azobisisobutyronitrile and organic peroxides such as benzoyl peroxide are generally used.

The catalyst used in the addition reaction of the ethylenically unsaturated double bond group-containing epoxy compound is not particularly limited, and known catalysts can be used. Examples thereof include amino catalysts such as dimethylaniline, 2,4,6-tris(dimethylaminomethyl)phenol, and dimethylbenzylamine; tin catalysts such as tin(II) 2-ethylhexanoate and dibutyltin laurate; titanium catalysts such as titanium(IV) 2-ethylhexanoate; phosphorus catalysts such as triphenylphosphine; and chromium catalysts such as chromium acetylacetonate and chromium chloride.

Examples of the carboxyl group- and/or acid anhydride group-containing (meth)acrylic compound include (meth)acrylic acid, (meth)acrylic anhydride, itaconic acid, itaconic anhydride, mono(2-acryloyloxyethyl)succinate, mono(2-acryloyloxyethyl)phthalate, and mono(2-acryloyloxyethyl) tetrahydrophthalate.

Examples of the used (meth)acrylic acid ester include methyl (meth)acrylate, ethyl (meth)acrylate, propyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, 2-(4-methoxycyclohexyl)oxycarbonylethyl (meth)acrylate, norbornyl (meth)acrylate, isobornyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, and 1-methyladamantyl (meth)acrylate. It is also possible to copolymerize an aromatic vinyl compound such as styrene, p-methylstyrene, o-methylstyrene, m-methylstyrene, or α-methylstyrene with the (meth)acrylic acid or (meth) acrylic acid ester.

Examples of the maleimide or maleimide derivative include maleimide, N-methylmaleimide, N-ethylmaleimide, N-n-propylmaleimide, N-isobutylmaleimide, N-n-butylmaleimide, N-t-butylmaleimide, N-n-hexylmaleimide, N-dodecylmaleimide, N-cyclopentylmaleimide, N-cyclohexylmaleimide, N-(2,4-dimethylcyclohexyl)maleimide, N-vinylmaleimide, N-(meth)acrylmaleimide, N-methoxymethylmaleimide, N-(2-ethoxyethyl)maleimide, N-[3-(meth) acryloxypropyl]maleimide, N-methoxycarbonylmaleimide, N-(3-methoxycarbonylpropyl)maleimide, N-(2-hydroxyethyl)maleimide, N-(4-hydroxy-n-butyl)maleimide, N-(2-carboxyethyl)maleimide, N-(3-carboxypropyl)maleimide, N-(5-carboxypentyl)maleimide, N-phenylmaleimide, N-(4-methylphenyl)maleimide, N-(3-methylphenyl)maleimide, N-(2-methylphenyl)maleimide, N-(2,6-dimethylphenyl)maleimide, N-(2,6-diethylphenyl)maleimide, N-(4-styryl)maleimide, N-(4-methoxyphenyl)maleimide, N-(3-methoxyphenyl)maleimide, N-(2-methoxyphenyl)maleimide, N-(4-hydroxyphenyl)maleimide, N-(3-hydroxyphenyl) maleimide, N-(2-hydroxyphenyl)maleimide, N-(4-carboxyphenyl)maleimide, N-(1-naphthyl)maleimide, N-benzylmaleimide, and N-(2-phenylethyl)maleimide.

Examples of the ethylenically unsaturated double bond group-containing epoxy compound include glycidyl (meth) acrylate, α-ethylglycidyl (meth)acrylate, α-n-propylglycidyl (meth)acrylate, α-n-butylglycidyl (meth)acrylate, 3,4-epoxybutyl (meth)acrylate, 3,4-epoxyheptyl (meth)acrylate, (3,4-epoxycyclohexylmethyl) (meth)acrylate, α-ethyl-6,7-epoxyheptyl (meth)acrylate, allyl glycidyl ether, vinyl glycidyl ether, o-vinylbenzyl glycidyl ether, m-vinylbenzyl glycidyl ether, p-vinylbenzyl glycidyl ether, α-methyl-o-vinylbenzyl glycidyl ether, α-methyl-m-vinylbenzyl glycidyl ether, α-methyl-p-vinylbenzyl glycidyl ether, 2,3-diglycidyloxymethyl styrene, 2,4-diglycidyloxymethyl styrene, 2,5-diglycidyloxymethyl styrene, 2,6-diglycidyloxymethyl styrene, 2,3,4-triglycidyloxymethyl styrene, 2,3,5-triglycidyloxymethyl styrene, 2,3,6-triglycidyloxymethyl styrene, 3,4,5-triglycidyloxymethyl styrene, and 2,4,6-triglycidyloxymethyl styrene.

The acrylic polymer (A1) used can also be a product obtained by polymerizing a polyfunctional (meth)acrylate compound and a polyvalent mercapto compound by Michael addition (to the β position of the carbonyl group).

Preferable specific examples of the polyfunctional (meth) acrylate compound include (meth)acrylic acid esters such as ethylene glycol di(meth)acrylate, diethylene glycol di(meth) acrylate, triethylene glycol di(meth)acrylate, tetraethylene glycol di(meth)acrylate, tetramethylene glycol di(meth) acrylate, trimethylolpropane tri(meth)acrylate, ethylene oxide-modified trimethylolpropane tri(meth)acrylate, propylene oxide-modified trimethylolpropane tri(meth)acrylate, trimethylolethane tri(meth)acrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta (meth)acrylate, caprolactone-modified pentaerythritol tri (meth)acrylate, caprolactone-modified pentaerythritol tetra (meth)acrylate, caprolactone-modified dipentaerythritol hexa(meth)acrylate, epichlorohydrin-modified hexahydrophthalic acid di(meth)acrylate, hydroxypivalic acid neopentyl glycol di(meth)acrylate, neopentyl glycol di(meth) acrylate, ethylene oxide-modified neopentyl glycol di(meth) acrylate, propylene oxide-modified neopentyl glycol di(meth)acrylate, caprolactone-modified hydroxypivalic acid ester neopentyl glycol di(meth)acrylate, stearic acid-modified pentaerythritol di(meth)acrylate, epichlorohydrin-modified phthalic acid di(meth)acrylate, poly(ethylene glycol tetramethylene glycol) di(meth)acrylate, poly(propylene glycol tetramethylene glycol) di(meth)acrylate, polyester (meth)acrylate, polyethylene glycol di(meth)acrylate, polyethylene glycol-polypropylene glycol-polyethylene glycol di(meth)acrylate, polypropylene glycol di(meth)acrylate, epichlorohydrin-modified propylene glycol di(meth)acrylate, propylene oxide-modified bisphenol A diglycidyl ether di(meth)acrylate, silicone di(meth)acrylate, triethylene glycol di(meth)acrylate, tetraethylene glycol di(meth)acrylate, tricyclodecane dimethanol di(meth)acrylate, neopentyl glycol-modified trimethylolpropane di(meth)acrylate, tripropylene glycol di(meth)acrylate, ethylene oxide-modified tripropylene glycol di(meth)acrylate, triglycerol di(meth) acrylate, dipropylene glycol di(meth)acrylate, epichlorohydrin-modified glycerol tri(meth)acrylate, ethylene oxide-modified glycerol tri(meth)acrylate, propylene oxide-modified glycerol tri(meth)acrylate, ethylene oxide-modified phosphoric acid tri(meth)acrylate, caprolactone-modified trimethylolpropane tri(meth)acrylate, HPA-modified trimethylolpropane tri(meth)acrylate, ethylene oxide-modified trimethylolpropane tri(meth)acrylate, propylene oxide-modified trimethylolpropane tri(meth)acrylate, trimethylolpropane benzoate (meth)acrylate, tris ((meth)acryloxyethyl)isocyanurate, alkoxy-modified trimethylolpropane tri(meth)acrylate, dipentaerythritol poly (meth)acrylate, alkyl-modified dipentaerythritol tri(meth) acrylate, and ditrimethylolpropane tetra(meth)acrylate. One of these compounds may be used alone, or two or more of these compounds may be used in combination.

Examples of the polyvalent mercapto compound include 1,2-dimercaptoethane, 1,3-dimercaptopropane, 1,4-dimercaptobutane, bisdimercaptoethanethiol (HS—$CH_2CH_2$—S—$CH_2CH_2$—SH), trimethylolpropane tri(mercaptoacetate), trimethylolpropane tri(mercaptopropionate), pentaerythritol tetra(mercaptoacetate), pentaerythritol tri(mercaptoacetate), pentaerythritol tetra(mercaptopropionate), dipentaerythritol hexa(mercaptoacetate), and dipentaerythritol hexa(mercaptopropionate). One of these compounds may be used alone, or two or more of these compounds may be used in combination.

[Cardo Based Resin (A2)]

Examples of the cardo based resin (A2) include a cardo based resin having two or more structures represented by the following general formula (1) as repeating units and containing a polymerizable group and an alkali-soluble group.

[Chemical Formula 1]

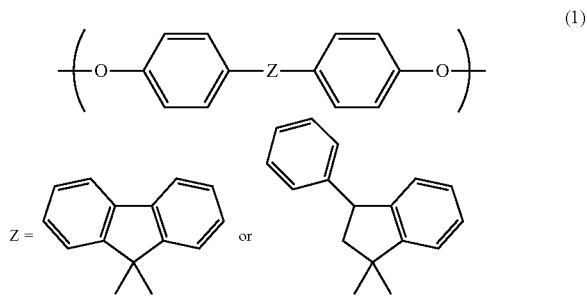

(1)

The cardo based resin (A2) can be obtained, for example, by reacting a reaction product of an epoxy compound and a radical polymerizable group-containing basic acid compound with an acid dianhydride.

The catalyst used in the polyaddition reaction and the addition reaction is not limited, and examples thereof include ammonium catalysts such as tetrabutylammonium acetate, amine catalysts such as 2,4,6-tris(dimethylaminomethyl)phenol and dimethylbenzylamine, phosphorus catalysts such as triphenylphosphine, and chromium catalysts such as chromium acetylacetonate and chromium chloride.

Examples of the epoxy compound include the following compounds.

[Chemical Formula 2]

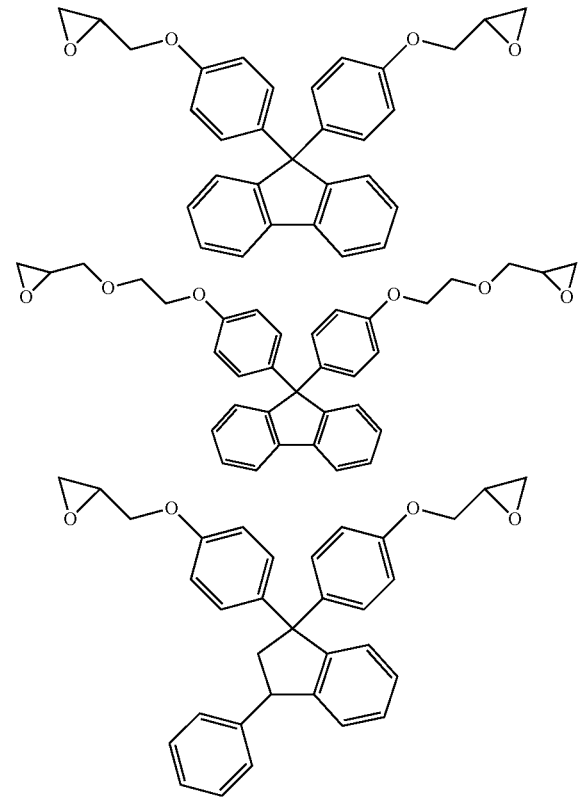

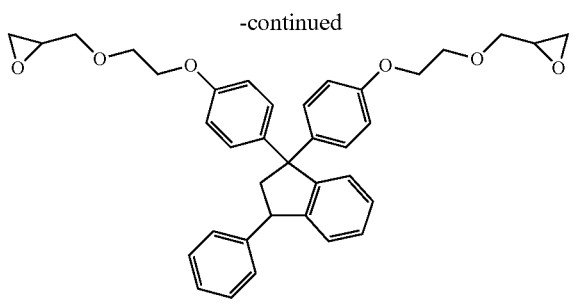

Examples of the radical polymerizable group-containing basic acid compound include (meth)acrylic acid, mono(2-(meth)acryloyloxyethyl)succinate, mono(2-(meth)acryloyloxyethyl)phthalate, mono(2-(meth)acryloyloxyethyl)tetrahydrophthalate, and p-hydroxystyrene.

Examples of the acid dianhydride include aromatic tetracarboxylic dianhydrides such as pyromellitic dianhydride, 3,3',4,4'-biphenyltetracarboxylic dianhydride, 2,3,3',4-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)hexafluoropropane dianhydride, 2,2-bis(2,3-dicarboxyphenyl)hexafluoropropane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl) ether dianhydride, 1,2,5,6-naphthalenetetracarboxylic dianhydride, 2,3,6,7-naphthalenetetracarboxylic dianhydride, 2,3,5,6-pyridinetetracarboxylic dianhydride, and 3,4,9,10-perylenetetracarboxylic dianhydride; and aliphatic tetracarboxylic dianhydrides such as butanetetracarboxylic dianhydride, cyclobutanetetracarboxylic dianhydride, 1,2,3,4-cyclopentanetetracarboxylic dianhydride, cyclohexanetetracarboxylic dianhydride, bicyclo[2.2.1.]heptanetetracarboxylic dianhydride, bicyclo[3.3.1.]tetracarboxylic dianhydride, bicyclo[3.1.1.]hept-2-ene tetracarboxylic dianhydride, bicyclo[2.2.2.]octanetetracarboxylic dianhydride, and adamantanetetracarboxylic dianhydride. In order to improve the chemical resistance of the cured film, pyromellitic dianhydride, 3,3',4,4'-biphenyltetracarboxylic dianhydride, 2,3,3',4-biphenyltetracarboxylic dianhydride, and 2,2',3,3'-biphenyltetracarboxylic dianhydride are preferable.

Part of the acid dianhydride may be replaced with an acid anhydride for the purpose of adjusting the molecular weight. Examples of the acid anhydride include succinic anhydride, maleic anhydride, itaconic anhydride, phthalic anhydride, trimellitic anhydride, pyromellitic monoanhydride, 2,3-biphenyldicarboxylic anhydride, 3,4-biphenyldicarboxylic anhydride, hexahydrophthalic anhydride, glutaric anhydride, 3-methylphthalic anhydride, norbornene dicarboxylic anhydride, cyclohexene dicarboxylic anhydride, and 3-trimethoxysilyl propyl succinic anhydride.

For the cardo based resin (A2), a commercially available product can be preferably used, and examples thereof include "WR-301 (trade name)" (manufactured by ADEKA Corporation), "V-259ME (trade name)" (manufactured by NIPPON STEEL & SUMIKIN CHEMICAL CO., LTD.), and "OGSOL CR-TR1 (trade name)", "OGSOL CR-TR2 (trade name)", "OGSOL CR-TR3 (trade name)", "OGSOL CR-TR4 (trade name)", "OGSOL CR-TR5 (trade name)", and "OGSOL CR-TR6 (trade name)" (all manufactured by Osaka Gas Chemicals Co., Ltd.).

The weight average molecular weights of the acrylic polymer (A1) and the cardo based resin (A2) (Mw(A1) and Mw(A2), respectively) are not particularly limited, and are each preferably 2,000 or more and 200,000 or less in terms of polystyrene as measured by gel permeation chromatography (GPC). When the Mw is within the above-mentioned range, satisfactory coating properties are obtained, and solubility of the photosensitive resin composition in a developing solution in pattern formation is also satisfactory. The ratio between Mw(A1) and Mw(A2) is preferably Mw(A2)/Mw(A1)≤1.5, more preferably 0.14 Mw(A2)/Mw(A1)≤1, still more preferably 0.14 Mw(A2)/Mw(A1)≤1.00. When the ratio is within the above-mentioned range, it is possible to form a uniform cured film without layer separation.

In the photosensitive resin composition of the present invention, the contents of the acrylic polymer (A1) and the cardo based resin (A2) are not particularly limited, and can be arbitrarily selected according to the desired film thickness and application. In general, the contents are each 10 parts by weight or more and 70 parts by weight or less based on 100 parts by weight of the solid content.

[Photopolymerization Initiator (B)]

The photosensitive resin composition of the present invention contains the photopolymerization initiator (B). The photopolymerization initiator (B) is decomposed by and/or reacts with light (including ultraviolet rays and electron beams) to generate radicals.

Specific examples of the photopolymerization initiator include combinations of a photoreducing dye such as 2-methyl-[4-(methylthio)phenyl]-2-morpholinopropan-1-one, 2-dimethylamino-2-(4-methylbenzyl)-1-(4-morpholin-4-yl-phenyl)-butan-1-one, 2-benzyl-2-dimethylamino-1-(4-morpholinophenyl)-butanone-1,2,4,6-trimethylbenzoyl phenylphosphine oxide, bis(2,4,6-trimethylbenzoyl)-phenylphosphine oxide, bis(2,6-dimethoxybenzoyl)-(2,4,4-trimethylpentyl)-phosphine oxide, 1-phenyl-1,2-propanedione-2-(o-ethoxycarbonyl)oxime, 1,2-octanedione,1-[4-(phenylthio)-2-(O-benzoyloxime)], 1-phenyl-1,2-butadione-2-(o-methoxycarbonyl)oxime, 1,3-diphenylpropanetrione-2-(o-ethoxycarbonyl)oxime, ethanone,1-[9-ethyl-6-(2-methylbenzoyl)-9H-carbazol-3-yl]-,1-(0-acetyloxime), 4,4-bis(dimethylamino)benzophenone, 4,4-bis(diethylamino)benzophenone, p-dimethylamino ethyl benzoate, 2-ethylhexyl-p-dimethylamino benzoate, p-diethylamino ethyl benzoate, diethoxy acetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl-(2-hydroxy-2-propyl)ketone, 1-hydroxycyclohexyl-phenyl ketone, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenylsulfide, alkylated benzophenone, 3,3',4,4'-tetra(t-butylperoxycarbonyl)benzophenone, 4-benzoyl-N,N-dimethyl-N-[2-(1-oxo-2-propenyloxy)ethyl]benzene methanaminium bromide, (4-benzoylbenzyl)trimethylammonium chloride, 2-hydroxy-3-(4-benzoylphenoxy)-N,N,N-trimethyl-1-propene aminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrenequinone, camphorquinone, methylphenylglyoxy ester, η5-cyclopentadienyl-η6-cumenyl-iron(1+)-hexafluorophosphate(1−), a diphenyl sulfide derivative, bis(η5-2,4-cyclopentadien-1-yl)-bis(2,6-difluoro-3-(1H-pyrrol-1-yl)-phenyl)titanium, thioxanthone, 2-methylthioxanthone, 2-chlorothioxanthone, 4-benzoyl-4-methylphenylketone, dibenzylketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzylmethoxyethyl acetal, anthraquinone, 2-t-butylanthraquinone, 2-aminoanthraquinone, β-chloroanthraquinone, anthrone, benzanthrone, dibenzosuberone, methylene anthrone, 4-azidobenzal acetophenone, 2,6-bis(p-azidobenzylidene)cyclohexane, 2,6-bis(p-azidobenzylidene)-4-methylcyclohexanone, naphthalenesulfonyl chloride, quinolinesulfonyl chloride, N-phenylthioacridone, benzothiazole disulfide, triphenylphosphine, tetrabrominated carbon, tribromophenylsulfone, benzoyl peroxide, eosin, and methylene blue, with a reducing agent such as ascorbic acid and triethanolamine. One of them or a combination of two or more of them can be used.

The content of the photopolymerization initiator (B) is not particularly limited, but is preferably 0.05 parts by weight to 20 parts by weight or less based on 100 parts by weight of the solid content. The content is more preferably 2 parts by weight or more and 15 parts by weight or less.

[Polyfunctional Allyl Compound (C)]

The photosensitive resin composition of the present invention may contain the polyfunctional allyl compound (C). When the photosensitive resin composition contains the polyfunctional allyl compound (C), the moisture and heat resistance of the cured film can be further improved and a cured film more satisfactory in patternability can be obtained, which contributes to an improvement in appearance of the product obtained by lamination processing. The polyfunctional allyl compound (C) is preferably a compound having an isocyanurate skeleton and represented by the following general formula (2):

[Chemical Formula 3]

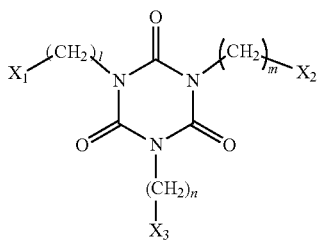

(2)

wherein l, m, and n each independently represent an integer of 0 to 8; $X_1$ and $X_2$ each represent an allyl group; and $X_3$ represents a hydrogen atom, an allyl group, a fluoro group, a chloro group, a bromo group, an iodo group, a carboxyl group, an epoxy group, an acrylic group, methacrylic group, or an alkoxy group.

Examples of the polyfunctional allyl compound (C) having an isocyanurate skeleton and represented by the general formula (2) include the following compounds, but the polyfunctional allyl compound (C) is not limited thereto.

[Chemical Formula 4]

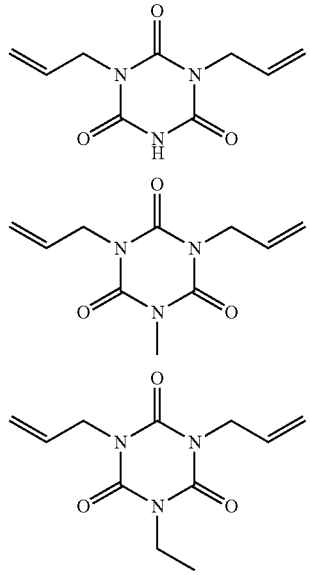

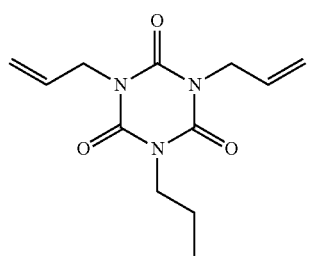

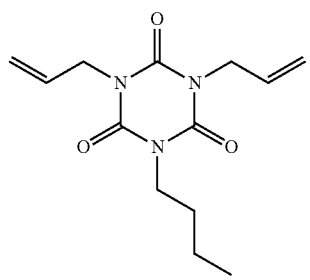

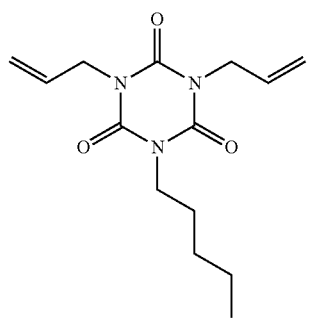

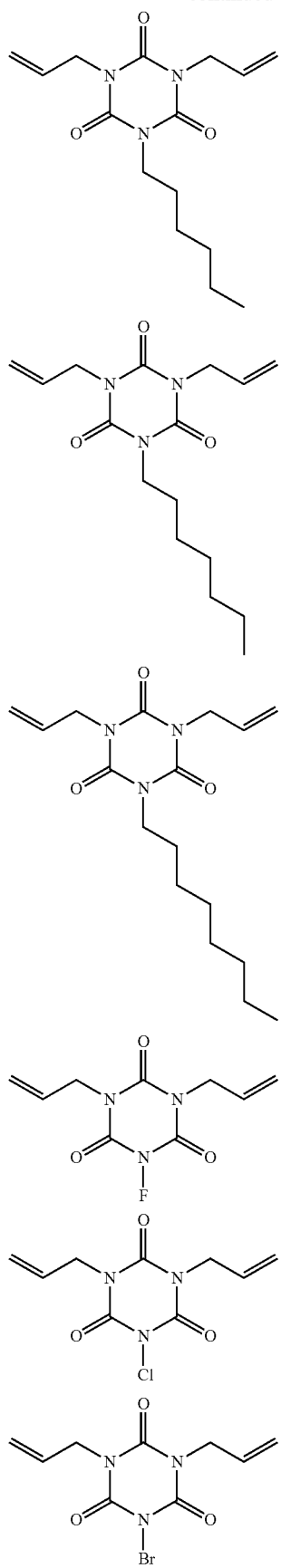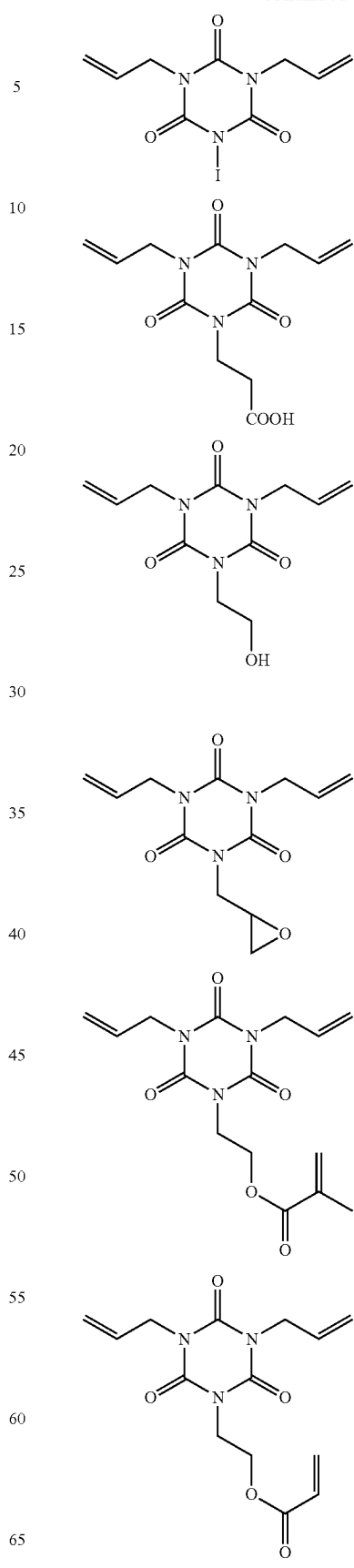

-continued

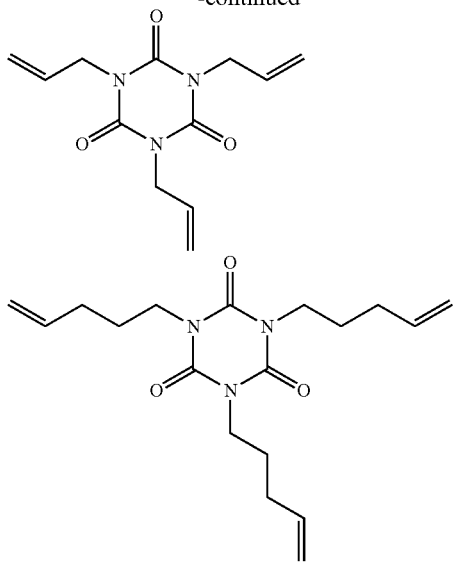

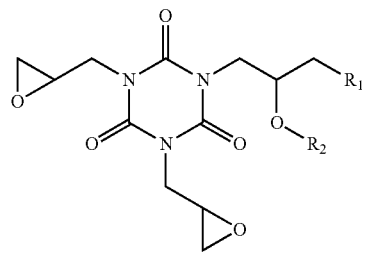

(4)

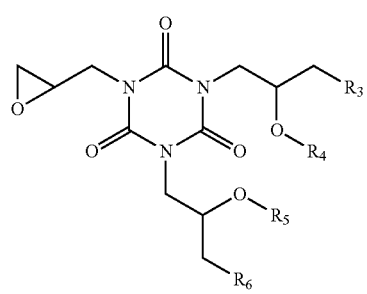

(5)

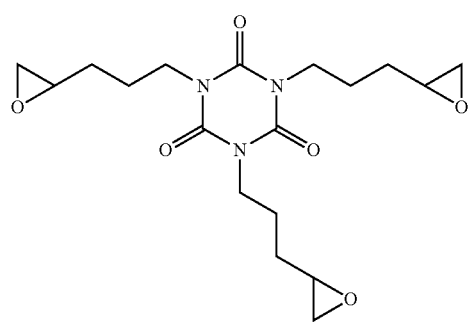

(6)

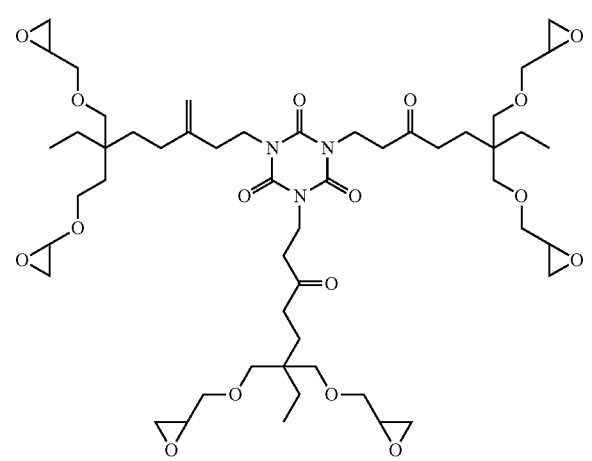

(7)

In the photosensitive resin composition of the present invention, the content of the polyfunctional allyl compound (C) is not particularly limited, and can be arbitrarily selected according to the desired application. The content is preferably 1 part by weight or more and 30 parts by weight or less, more preferably 5 parts by weight or more and 20 parts by weight or less based on 100 parts by weight of the solid content. One of them or a combination of two or more of them can be used.

[Polyfunctional Epoxy Compound (D)]

The photosensitive resin composition of the present invention may contain the polyfunctional epoxy compound (D). When the photosensitive resin composition contains the polyfunctional epoxy compound (D), the moisture and heat resistance of the cured film can be further improved and a smoother cured film can be obtained due to suppression of the film shrinkage during the curing, which contributes to an improvement in appearance of the product obtained by lamination processing. The polyfunctional epoxy compound (D) is preferably a polyfunctional epoxy compound (d1) having an isocyanurate skeleton and/or a polyfunctional epoxy compound (d2) having four or more aromatic rings and also having quaternary carbon having three or more bonds with the aromatic rings.

Examples of the polyfunctional epoxy compound (d1) having an isocyanurate skeleton include compounds of the following formulae (3) to (7):

[Chemical Formula 5]

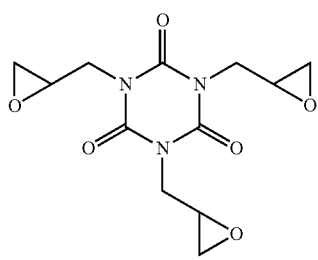

(3)

wherein $R_1$ to $R_2$ and $R_3$ to $R_6$ each independently represent a substituent, such as an alkyl group having 1 to 6 carbon atoms, an alkoxyl group having 1 to 6 carbon atoms, a phenyl group, a phenoxy group, an alkylcarbonyloxy group having 2 to 6 carbon atoms, or a substitution product thereof.

Examples of the polyfunctional epoxy compound (d2) having four or more aromatic rings and also having quaternary carbon having three or more bonds with the aromatic rings include compounds of the following formulae (8) to (12):

[Chemical Formula 6]

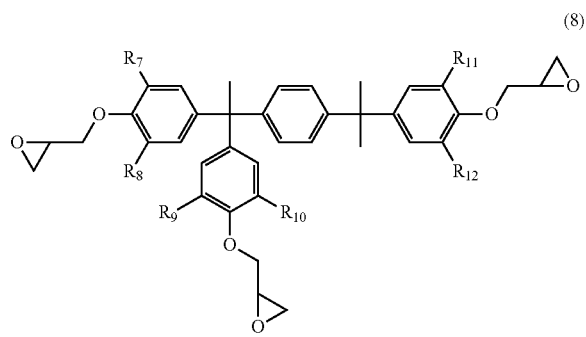
(8)

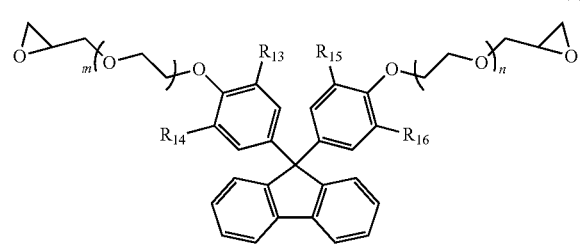
(9)

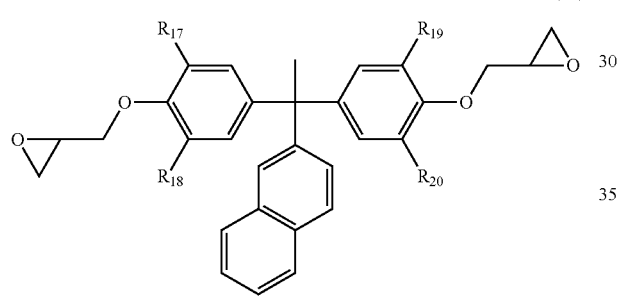
(10)

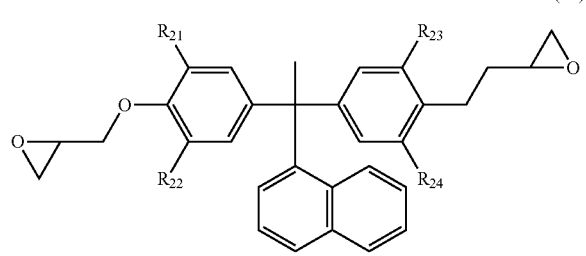
(11)

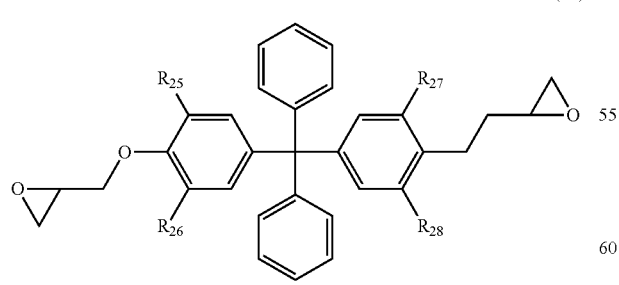
(12)

wherein $R_7$ to $R_{12}$, $R_{13}$ to $R_{16}$, $R_{17}$ to $R_{20}$, $R_{21}$ to $R_{24}$, and $R_{25}$ to $R_{28}$ each independently represent hydrogen, fluorine, a methyl group, an ethyl group, or a cyclohexyl group; and m and n each represent an integer of 0 to 15.

Among them, the compounds of the formulae (8) and (9) are preferable because they are particularly effective for improving the moisture and heat resistance.

In the photosensitive resin composition of the present invention, the content of the polyfunctional epoxy compound (D) is not particularly limited, and can be arbitrarily selected according to the desired application. The content is preferably 1 part by weight or more and 30 parts by weight or less, more preferably 5 parts by weight or more and 20 parts by weight or less based on 100 parts by weight of the solid content. One of them or a combination of two or more of them can be used.

[Hindered Amine Light Stabilizer (E)]

The photosensitive resin composition of the present invention may contain the hindered amine light stabilizer (E). When the photosensitive resin composition contains the hindered amine light stabilizer (E), the coloring of the cured film can be reduced, and the weather resistance can be improved.

Examples of the hindered amine light stabilizer (E) include the following formulae (13) to (17):

[Chemical Formula 7]

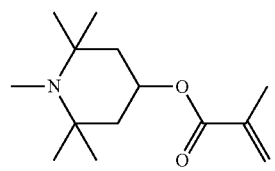
(13)

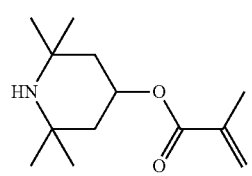
(14)

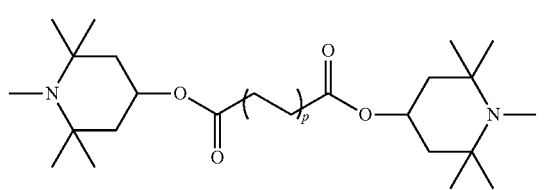
(15)

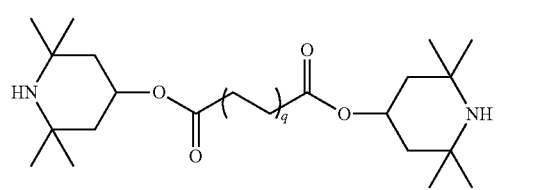
(16)

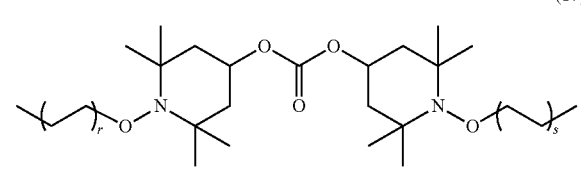
(17)

wherein p, q, r, and s each represent an integer of 0 to 15.

In particular, the hindered amine light stabilizer (E) preferably has an unsaturated double bond because it has high reactivity and acts on curing. For example, the formulae (13) and (14) both having an unsaturated double bond are particularly preferable.

In the photosensitive resin composition of the present invention, the content of the hindered amine light stabilizer (E) is not particularly limited, but is preferably 0.01 to 10 parts by weight based on 100 parts by weight of the solid content. The content is more preferably 0.05 parts by weight or more and 5 parts by weight or less. One of them or a combination of two or more of them can be used.

[Silane Coupling Agent (F)]

The photosensitive composition of the present invention may contain the silane coupling agent (F). When the photosensitive resin composition contains the silane coupling agent (F), adhesiveness to the substrate is improved.

Specific examples of the silane coupling agent (F) include methyltrimethoxysilane, methyltriethoxysilane, dimethyldimethoxysilane, dimethyldiethoxysilane, ethyltrimethoxysilane, ethyltriethoxysilane, n-propyltrimethoxysilane, n-propyltriethoxysilane, n-butyltrimethoxysilane, n-butyltriethoxysilane, phenyltrimethoxysilane, phenyltriethoxysilane, diphenyldimethoxysilane, diphenyldiethoxysilane, vinyltrimethoxysilane, vinyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, 3-glycidoxypropyltrimethoxysilane, 3-glycidoxypropyltriethoxysilane, 3-glycidoxypropylmethyldiethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-mercaptopropylmethyldimethoxysilane, 3-ureidopropyltriethoxysilane, 3-isocyanatepropyltriethoxysilane, 3-trimethoxysilylpropylsuccinic acid, and N-t-butyl-3-(3-trimethoxysilylpropyl)succinimide.

In particular, the silane coupling agent (F) preferably contains nitrogen from the viewpoint of improving the adhesiveness to the substrate. Since nitrogen acts as a catalyst for the condensation reaction between the silane coupling agent (F) and the substrate surface, the adhesiveness is greatly improved.

Specific examples of the silane coupling agent (F) containing nitrogen include 3-aminopropyltrimethoxysilane, 3-aminopropyltriethoxysilane, N-2-(aminoethyl)-3-aminopropylmethyldimethoxysilane, N-2-(aminoethyl)-3-aminopropylmethyldiethoxysilane, N-2-(aminoethyl)-3-aminopropyltrimethoxysilane, N-2-(aminoethyl)-3-aminopropyltriethoxysilane, N-(vinylbenzyl)-2-aminoethyl-3-aminopropyltrimethoxysilane hydrochloride, N-(vinylbenzyl)-2-aminoethyl-3-aminopropyltriethoxysilane hydrochloride, tris-(trimethoxysilylpropyl)isocyanurate, tris-(triethoxysilylpropyl)isocyanurate, 3-triethoxysilyl-N-(1,3-dimethyl-butylidene)propylamine, 3-trimethoxysilyl-N-(1,3-dimethyl-butylidene)propylamine, N-phenyl-3-aminopropyltrimethoxysilane, N-phenyl-3-aminopropyltriethoxysilane, 3-ureidopropyltriethoxysilane, 3-ureidopropyltrimethoxysilane, 3-isocyanatepropyltriethoxysilane, 3-isocyanatepropyltrimethoxysilane, N-t-butyl-3-(3-trimethoxysilylpropyl)succinimide, and N-t-butyl-3-(3-triethoxysilylpropyl)succinimide.

Among them, 3-ureidopropyltriethoxysilane and 3-ureidopropyltrimethoxysilane are particularly preferable from the viewpoint of storage stability.

The amount of the silane coupling agent (F) added is not particularly limited, but is preferably in the range of 0.1 to 10 parts by weight based on 100 parts by weight of the solid content. If the addition amount is less than 0.1 parts by weight, the effect of improving the adhesiveness is insufficient. If the addition amount is more than 10 parts by weight, the silane coupling agents undergo a condensation reaction with each other during storage, and cause undissolved residue during development.

[Polyfunctional Monomer]

The photosensitive resin composition of the present invention may contain a polyfunctional monomer for the purpose of adjusting the sensitivity of the resin composition. A "polyfunctional monomer" refers to a compound having at least two ethylenically unsaturated double bonds in the molecule. In consideration of ease of radical polymerization, a polyfunctional monomer having a (meth)acryloyl group is preferable. Specific examples of the polyfunctional monomer are listed below, but the polyfunctional monomer is not limited thereto.

Examples of a polymerizable compound having two (meth)acryloyl groups in the molecule include 1,3-butanediol di(meth)acrylate, 1,4-butanediol di(meth)acrylate, 1,6-hexanediol di(meth)acrylate, 1,9-nonanediol di(meth)acrylate, 1,10-decanediol di(meth)acrylate, neopentyl glycol di(meth)acrylate, 2,4-dimethyl-1,5-pentanediol di(meth)acrylate, butylethyl propanediol di(meth)acrylate, ethoxylated cyclohexane methanol di(meth)acrylate, polyethylene glycol di(meth)acrylate, oligoethylene glycol di(meth)acrylate, dipropylene glycol di(meth)acrylate, polypropylene glycol di(meth)acrylate, 2-ethyl-2-butyl-propanediol di(meth)acrylate, 2-ethyl-2-butyl-butanediol di(meth)acrylate, hydroxypivalic acid neopentyl glycol di(meth)acrylate, EO-modified bisphenol A di(meth)acrylate, bisphenol F polyethoxy di(meth)acrylate, oligopropylene glycol di(meth)acrylate, propoxylated ethoxylated bisphenol A di(meth)acrylate, tricyclodecane di(meth)acrylate, bis(2-hydroxyethyl)isocyanurate di(meth)acrylate, ethoxylated bisphenol A diacrylate, 9,9-bis[4-(2-(meth)acryloyloxyethoxy)phenyl]fluorene, 9,9-bis[4-(2-(meth)acryloyloxyethoxy)-3-methylphenyl]fluorene, 9,9-bis[4-(2-(meth)acryloyloxypropoxy)-3-methylphenyl]fluorene, and 9,9-bis[4-(2-(meth)acryloyloxyethoxy)-3,5-dimethylphenyl]fluorene.

Examples of a polymerizable compound having three (meth)acryloyl groups in the molecule include trimethylolpropane tri(meth)acrylate, trimethylolethane tri(meth)acrylate, trimethylolpropane alkylene oxide-modified tri(meth)acrylate, pentaerythritol tri(meth)acrylate, dipentaerythritol tri(meth)acrylate, trimethylolpropane tri((meth)acryloyloxypropyl)ether, glycerol tri(meth)acrylate, tris(2-hydroxyethyl)isocyanurate tri(meth)acrylate, isocyanuric acid alkylene oxide-modified tri(meth)acrylate, propionic acid dipentaerythritol tri(meth)acrylate, tri((meth)acryloyloxyethyl)isocyanurate, hydroxy pivalaldehyde-modified dimethylol propane tri(meth)acrylate, sorbitol tri(meth)acrylate, propoxylated trimethylolpropane tri(meth)acrylate, and ethoxylated glycerol triacrylate.

Examples of a polymerizable compound having four (meth)acryloyl groups in the molecule include pentaerythritol tetra(meth)acrylate, sorbitol tetra(meth)acrylate, ditrimethylolpropane tetra(meth)acrylate, dipentaerythritol propionate tetra(meth)acrylate, and ethoxylated pentaerythritol tetra(meth)acrylate.

Examples of a polymerizable compound having five (meth)acryloyl groups in the molecule include sorbitol penta(meth)acrylate and dipentaerythritol penta(meth)acrylate.

Examples of a polymerizable compound having six (meth)acryloyl groups in the molecule include dipentaerythritol hexa(meth)acrylate and sorbitol hexa(meth)acrylate. Examples of such polymerizable compound having six (meth)acryloyl groups in the molecule also include alkylene oxide-modified hexa(meth)acrylate of phosphazene and caprolactone-modified dipentaerythritol hexa(meth)acrylate.

Examples of a polymerizable compound having seven (meth)acryloyl groups in the molecule include tripentaerythritol heptaacrylate.

Examples of a polymerizable compound having eight (meth)acryloyl groups in the molecule include tripentaerythritol octaacrylate. One of them or a combination of two or more of them can be used.

[Curing Agent]

The photosensitive resin composition of the present invention may contain various curing agents that promote curing of the resin composition or make curing of the resin composition easy. The curing agent is not particularly limited, and known curing agents can be used. Specific examples thereof include nitrogen-containing organic substances, silicone resin curing agents, various metal alcoholates, various metal chelate compounds, isocyanate compounds and polymers thereof, methylolated melamine derivatives, and methylolated urea derivatives. The photosensitive resin composition may contain two or more of them. Among them, metal chelate compounds, methylolated melamine derivatives, and methylolated urea derivatives are preferably used from the viewpoint of stability of the curing agent and workability of the obtained coating film.

[Ultraviolet Absorber]

The photosensitive resin composition of the present invention may contain an ultraviolet absorber. Incorporation of an ultraviolet absorber improves the lightfastness of the obtained cured film, and improves the resolution after development in applications requiring patterning. The ultraviolet absorber is not particularly limited, and known ultraviolet absorbers can be used. The ultraviolet absorber is preferably a benzotriazole compound, a benzophenone compound, or a triazine compound from the viewpoint of transparency and non-coloring properties.

[Polymerization Inhibitor]

The photosensitive resin composition of the present invention may contain a polymerization inhibitor. Incorporation of an appropriate amount of a polymerization inhibitor improves the resolution after development. The polymerization inhibitor is not particularly limited, and known polymerization inhibitors can be used. Examples thereof include di-t-butylhydroxytoluene, butylhydroxyanisole, hydroquinone, 4-methoxyphenol, 1,4-benzoquinone, and t-butylcatechol. Examples of commercially available polymerization inhibitors include "IRGANOX 1010", "IRGANOX 1035", "IRGANOX 1076", "IRGANOX 1098", "IRGANOX 1135", "IRGANOX 1330", "IRGANOX 1726", "IRGANOX 1425", "IRGANOX 1520", "IRGANOX 245", "IRGANOX 259", "IRGANOX 3114", "IRGANOX 565", and "IRGANOX 295" (all manufactured by BASF Japan Ltd.).

[Solvent]

The photosensitive resin composition of the present invention may contain a solvent. The solvent contained in the photosensitive resin composition of the present invention preferably has a boiling point under atmospheric pressure of 110 to 250° C., more preferably 200° C. or lower. Two or more of such solvents may be used. If the boiling point is higher than 200° C., a large amount of the solvent remains in the film, the film largely shrinks during the curing, and satisfactory flatness cannot be obtained. On the other hand, if the boiling point is lower than 110° C., the composition is too rapidly dried at the time of coating to deteriorate the coating film properties, that is, the film surface is roughened. Therefore, it is preferable that the solvent having a boiling point under atmospheric pressure of 200° C. or lower account for 50 parts by weight or more of the entire solvents in the photosensitive resin composition.

Specific examples of the solvent include ethanol, isopropyl alcohol, 1-propyl alcohol, 1-butanol, 2-butanol, isopentyl alcohol, ethylene glycol monomethyl ether, ethylene glycol dimethyl ether, ethylene glycol monoethyl ether, methoxymethyl acetate, propylene glycol monomethyl ether, propylene glycol monoethyl ether, propylene glycol monomethyl ether acetate, propylene glycol monopropyl ether, ethylene glycol monomethyl ether acetate, 1-methoxypropyl-2-acetate, acetol, acetylacetone, methyl isobutyl ketone, methyl ethyl ketone, methyl propyl ketone, methyl lactate, toluene, cyclopentanone, cyclohexane, n-heptane, benzene, methyl acetate, ethyl acetate, propyl acetate, isobutyl acetate, butyl acetate, isopentyl acetate, pentyl acetate, 3-hydroxy-3-methyl-2-butanone, 4-hydroxy-3-methyl-2-butanone, 5-hydroxy-2-pentanone, ethylene glycol diethyl ether, ethylene glycol mono-n-butyl ether, ethylene glycol mono-tert-butyl ether, propylene glycol mono n-butyl ether, propylene glycol mono t-butyl ether, 2-ethoxyethyl acetate, 3-methoxy-1-butanol, 3-methoxy-3-methylbutanol, 3-methoxy-3-methylbutyl acetate, 3-methoxybutyl acetate, ethyl 3-ethoxypropionate, propylene glycol monomethyl ether propionate, dipropylene glycol methyl ether, diisobutyl ketone, diacetone alcohol, ethyl lactate, butyl lactate, dimethylformamide, dimethylacetamide, γ-butyrolactone, γ-valerolactone, δ-valerolactone, propylene carbonate, N-methylpyrrolidone, cyclohexanone, cycloheptanone, diethylene glycol monobutyl ether, and ethylene glycol dibutyl ether.

The content of the solvent is not particularly limited, and the solvent can be used in any amount depending on the coating method or the like. For example, in the case of forming a film by spin coating, in general, the content of the solvent is 50 parts by weight or more and 95 parts by weight or less of the total amount of the photosensitive resin composition.

[Surfactant]

The photosensitive resin composition of the present invention may contain-various surfactants such as various fluorochemical surfactants and silicone surfactants in order to improve the flowability during the coating. The type of the surfactant is not particularly limited, and examples thereof include fluorochemical surfactants such as "MEGAFACE (registered trademark)" "F142D (trade name)", "F172 (trade name)", "F173 (trade name)", "F183 (trade name)", "F445 (trade name)", "F470 (trade name)", "F475 (trade name)", and "F477 (trade name)" (all manufactured by Dainippon Ink and Chemicals, Incorporated), and "NBX-15 (trade name)" and "FTX-218 (trade name)" (manufactured by NEOS COMPANY LIMITED); silicone surfactants such as "BYK-333 (trade name)", "BYK-301 (trade name)", "BYK-331 (trade name)", "BYK-345 (trade name)", and "BYK-307 (trade name)" (manufactured by BYK Japan KK); polyalkylene oxide surfactants; and poly(meth)acrylate surfactants. The photosensitive resin composition may contain two or more of them.

The photosensitive resin composition of the present invention may contain additives such as dissolution inhibitors, stabilizers, and antifoaming agents, if necessary.

The solid content concentration of the photosensitive resin composition of the present invention is not particularly limited, and any solvent or solute can be used in any amount depending on the coating method or the like. For example, in the case of forming a film by spin coating as described later, in general, the solid content concentration is 5 parts by weight or more and 50 parts by weight or less. Herein, the solid content is obtained by excluding the solvent from the photosensitive resin composition.

A typical method for manufacturing the photosensitive resin composition of the present invention will be described. For example, the photosensitive resin composition is obtained by adding the acrylic polymer (A1), the cardo based resin (A2), the photopolymerization initiator (B), the polyfunctional allyl compound (C), the polyfunctional epoxy compound (D), the hindered amine light stabilizer (E), the silane coupling agent (F) and, if necessary, other additives to an arbitrary solvent, dissolving them by stirring, and then filtrating the resulting solution.

A method for manufacturing a cured film using the photosensitive resin composition of the present invention will be described with reference to examples. The photosensitive resin composition of the present invention is applied to a base substrate by a known method such as microgravure coating, spin coating, dip coating, curtain flow coating, roll coating, spray coating, or slit coating. The obtained coating film is prebaked with a heating device such as a hot plate or an oven. The photosensitive resin composition is prebaked at a temperature in the range of 50 to 150° C. for 30 seconds to 30 minutes. After the prebaking, the film of the photosensitive resin composition preferably has a thickness of 0.1 to 15 µm.

After the prebaking, the coating film is exposed to light with an exposure machine such as a stepper, a mirror projection mask aligner (MPA), or a parallel light mask aligner (PLA). The exposure intensity is about 10 to 4000 J/m$^2$ (in terms of the exposure amount at a wavelength of 365 nm), and the film is irradiated with light of this intensity with or without a desired mask. There are no limitations on the exposure light source, and ultraviolet rays such as g-line, h-line, and i-line, KrF (wavelength: 248 nm) laser, ArF (wavelength: 193 nm) laser and the like can be used.

Then, the unexposed portion of the coating film is dissolved by development to give a negative pattern. As for the development method, the coating film is preferably immersed in a developing solution for 5 seconds to 10 minutes by a method such as showering, dipping, or paddling. The developing solution may be a known alkali developing solution. Specific examples thereof include aqueous solutions containing one or more of inorganic alkalis such as hydroxides, carbonates, phosphates, silicates, and borates of alkali metals; amines such as 2-diethylaminoethanol, monoethanolamine, and diethanolamine; and quaternary ammonium salts such as tetramethylammonium hydroxide and choline. After the development, it is preferable to rinse the coating film with water. Then, the coating film can be dry-baked at a temperature in the range of 50 to 130° C.

Then, the coating film is heated with a heating device such as a hot plate or an oven at a temperature in the range of 140 to 300° C. for about 15 minutes to 1 hour. The method for manufacturing a cured film of the present invention preferably includes the step of heating the coating film at 200 to 250° C.

The thickness of the cured film obtained from the photosensitive resin composition of the present invention is not particularly limited, but is preferably 0.1 to 15 µm. Further, a film having a thickness of 2.0 µm preferably has a transmittance of 85% or more. The transmittance refers to the transmittance at a wavelength of 400 nm. The transmittance can be adjusted by selecting the exposure amount and the thermal curing temperature.

A cured film obtained by curing the photosensitive resin composition of the present invention can be used as various protective films such as protective films for touch panels, various hard coat materials, flattening films for TFTs, overcoats for color filters, antireflection films, and passivation films, optical filters, insulating films for touch panels, insulating films for TFTs, photo spacers for color filters, and the like. In particular, the cured film can be suitably used as an insulating film for a touch panel since the cured film has high moisture and heat resistance and substrate adhesiveness.

Further, a cured film obtained by curing the photosensitive resin composition of the present invention can be suitably used as a metal wire protective film since the cured film has ion migration resistance under high temperature and high humidity conditions. That is, it is preferable that the cured film of the present invention form a laminate with a conductive layer. A laminate including the cured film of the present invention between a plurality of conductive layers is more preferable. The material of the metal wire to be protected, that is, the conductive material contained in the conductive layer is not particularly limited, and examples thereof include copper, silver, aluminum, chromium, molybdenum, titanium, ITO, indium zinc oxide (IZO), aluminum-doped zinc oxide (AZO), and ZnO$_2$. Silver is preferable. The silver preferably has a primary particle diameter of 10 to 200 nm. In addition, it is preferable that the conductive layers contain an organic component having at least an alkali-soluble group in an amount of 5 to 35 wt %.

EXAMPLES

Hereinafter, the present invention will be described more specifically with reference to examples, but the present invention is not limited to these examples. Among the compounds used in synthesis examples and examples, those abbreviated are shown below.

AIBN: 2,2'-azobis(isobutyronitrile)
PGMEA: propylene glycol monomethyl ether acetate
DAA: diacetone alcohol
DPM: dipropylene glycol monomethyl ether First, the materials used in examples and comparative examples will be described.

[Acrylic Polymer (A1)]
Synthesis Example of Acrylic Polymer Solution (a1-1)

Into a 500-ml flask, 2 g of AIBN and 50 g of PGMEA were charged. Then, 26.5 g of methacrylic acid, 21.3 g of styrene, and 37.7 g of tricyclo[5.2.1.0(2,6)]decane-8-yl methacrylate were charged thereinto, and stirred for a while at room temperature. The inside of the flask was thoroughly purged with nitrogen by bubbling, and the contents were heated and stirred at 70° C. for 5 hours. Then, 14.6 g of glycidyl methacrylate, 1 g of dimethylbenzylamine, 0.2 g of p-methoxyphenol, and 100 g of PGMEA were added to the obtained solution, and the mixture was heated and stirred at 90° C. for 4 hours to give an acrylic polymer solution. PGMEA was added to the acrylic polymer solution so that the obtained mixture would have a solid content concentration of 40 wt % to give an acrylic polymer solution (a1-1).

The acrylic polymer had a weight average molecular weight Mw in terms of polystyrene of 13,500 as measured by the GPC method.

Synthesis Example of Acrylic Polymer Solution (a1-2)

Into a 500-ml flask, 1 g of AIBN and 50 g of PGMEA were charged. Then, 23.0 g of methacrylic acid, 31.5 g of benzyl methacrylate, and 32.8 g of tricyclo[5.2.1.0(2,6)] decane-8-yl methacrylate were charged thereinto, and stirred for a while at room temperature. The inside of the flask was thoroughly purged with nitrogen by bubbling, and the contents were heated and stirred at 70° C. for 5 hours. Then, 12.7 g of glycidyl methacrylate, 1 g of dimethylbenzylamine, 0.2 g of p-methoxyphenol, and 100 g of PGMEA were added to the obtained solution, and the mixture was heated and stirred at 90° C. for 4 hours to give an acrylic polymer solution. PGMEA was added to the acrylic polymer solution so that the obtained mixture would have a solid content concentration of 40 wt % to give an acrylic polymer solution (a1-2). The acrylic polymer had a weight average molecular weight Mw in terms of polystyrene of 17,000 as measured by the GPC method.

Synthesis Example of Acrylic Polymer Solution (a1-3)

Into a 500-ml flask, 1 g of AIBN and 50 g of PGMEA were charged. Then, 19.4 g of methacrylic acid, 12.5 g of methyl methacrylate, and 32.8 g of N-benzylmaleimide were charged thereinto, and stirred for a while at room temperature. The inside of the flask was thoroughly purged with nitrogen by bubbling, and the contents were heated and stirred at 70° C. for 5 hours. Then, 14.2 g of glycidyl methacrylate, 1 g of dimethylbenzylamine, 0.2 g of p-methoxyphenol, and 100 g of PGMEA were added to the obtained solution, and the mixture was heated and stirred at 90° C. for 4 hours to give an acrylic polymer solution. PGMEA was added to the acrylic polymer solution so that the obtained mixture would have a solid content concentration of 40 wt % to give an acrylic polymer solution (a1-3). The acrylic polymer had a weight average molecular weight Mw in terms of polystyrene of 12,000 as measured by the GPC method.

Adjustment Example of Acrylic Polymer Solution (a1-4)

"CYCLOMER (registered trademark) ACA 2250" (trade name) manufactured by DAICEL CHEMICAL INDUSTRIES, LTD., which has the following formula (18) and is a solution of an acrylic polymer in DPM, is a product having a solid content concentration of 55 wt % and a weight average molecular weight Mw in terms of polystyrene of 22,000 as Measured by the GPC method. "CYCLOMER ACA 2250" (100 g) was weighed, and 37.5 g of DPM was added thereto with stirring. In this way, a solution (a1-4) of an acrylic polymer in DPM having a solid content concentration of 40 wt % was obtained.

[Chemical Formula 8]

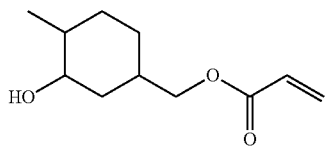

(18)

Adjustment Example of Acrylic Polymer Solution (a1-5)

Into a 500-ml flask, 1 g of AIBN and 50 g of PGMEA were charged. Then, 38.6 g of methacrylic acid, 16.4 g of methyl methacrylate, and 16.4 g of styrene were charged thereinto, and stirred for a while at room temperature. The inside of the flask was thoroughly purged with nitrogen by bubbling, and the contents were heated and stirred at 70° C. for 5 hours. Then, 28.6 g of glycidyl methacrylate, 1 g of dimethylbenzylamine, 0.2 g of p-methoxyphenol, and 100 g of PGMEA were added to the obtained solution, and the mixture was heated and stirred at 90° C. for 4 hours to give an acrylic polymer solution. PGMEA was added to the acrylic polymer solution so that the obtained mixture would have a solid content concentration of 40 wt % to give an acrylic polymer solution (a1-5). The acrylic polymer had a weight average molecular weight Mw in terms of polystyrene of 29,000 as measured by the GPC method.

Adjustment Example of Acrylic Polymer Solution (a1-6)

A dendrimer polyfunctional acrylate ("SIRIUS-501 (trade name)" manufactured by Osaka Organic Chemical Industry Ltd., hereinafter referred to as "SIRIUS-501") is a product having a solid content concentration of 50 wt % and a weight average molecular weight Mw in terms of polystyrene of 20,000 as measured by the GPC method. "SIRIUS-501" (100 g) was weighed, and 25 g of PGMEA was added thereto with stirring. In this way, the product was used as an acrylic polymer solution (a1-6) having a solid content concentration of 40 wt %.

Synthesis Example of Polysiloxane Solution (a1'-1) (Comparative Synthesis Example)

Into a 500-ml three-necked flask, 23.8 g of methyltrimethoxysilane, 19.8 g of phenyltrimethoxysilane, 13.1 g of 3-trimethoxysilylpropylsuccinic acid, 43.4 g of γ-acryloylpropyltrimethoxysilane, and 100 g of PGMEA were charged. While the mixture was immersed in an oil bath at 40° C. with stirring, an aqueous phosphoric acid solution obtained by dissolving 0.20 g of phosphoric acid in 27.9 g of water was added over 10 minutes using a dropping funnel. After stirring at 40° C. for 1 hour, the oil bath temperature was set to 70° C. and the mixture was stirred for 1 hour, and the oil bath was further heated to 115° C. over 30 minutes. One hour after the start of heating, the internal temperature of the solution reached 100° C., and then the solution was heated and stirred for 2 hours (the internal temperature was 100 to 110° C.). During the reaction, total of 60 g of methanol and water as by-products were distilled out. To the obtained PGMEA solution of polysiloxane, PGMEA was added so that the obtained mixture would have a polysiloxane concentration of 40 wt % to give a polysiloxane solution (a1'-1). The weight average molecular weight Mw of the obtained polymer was measured by GPC, and was found to be 5,500 (in terms of polystyrene).

[Cardo Based Resin (A2)]

Adjustment Example of Cardo Based Resin Solution (a2-1)

"V-259ME (trade name)" manufactured by NIPPON STEEL & SUMIKIN CHEMICAL CO., LTD., which is a PGMEA solution of the cardo based resin (A2) containing an ethylenically unsaturated group and a carboxyl group, is a product having a solid content concentration of 45.6 wt % and a weight average molecular weight Mw in terms of polystyrene of 3,500 as measured by the GPC method. "V-259ME" (100 g) was weighed, and 14.0 g of PGMEA was added thereto with stirring. In this way, a cardo based resin solution (a2-1) having a solid content concentration of 40 wt % was obtained.

Adjustment Example of Cardo Based Resin Solution (a2-2)

"WR-301 (trade name)" manufactured by ADEKA Corporation, which is a PGMEA solution of the cardo based resin (A2) containing an ethylenically unsaturated group and a carboxyl group, is a product having a solid content concentration of 45 wt % and a weight average molecular weight Mw in terms of polystyrene of 5,500 as measured by the GPC method. "WR-301" (100 g) was weighed, and 12.5 g of PGMEA was added thereto with stirring. In this way, a cardo based resin solution (a2-2) having a solid content concentration of 40 wt % was obtained.

[Photopolymerization Initiator (B)]

Ethanone,1-[9-ethyl-6-(2-methylbenzoyl)-9H-carbazol-3-yl]-,1-(0-acetyloxime) ("IRGACURE (registered trademark)" OXE02 (trade name) manufactured by BASF Japan Ltd., hereinafter referred to as "OXE-02")

1,2-Octanedione,1-[4-(phenylthio)-,2-(O-benzoyloxime)] ("IRGACURE (registered trademark)" OXE01 (trade name) manufactured by BASF Japan Ltd., hereinafter referred to as "OXE-01")

1,2-Propanedione,1-[4-(phenylthio)-,2-(O-benzoyloxime)]-3-cyclopentyl ("PBG-305 (trade name)" manufactured by Changzhou Tronly New Electronic Materials Co., Ltd., hereinafter referred to as "PBG-305")

[Polyfunctional Allyl Compound (C)]

Triallyl isocyanurate ("TAIC (trade name)" manufactured by Nippon Kasei Chemical Company Limited, hereinafter referred to as "TAIC")

[Polyfunctional Epoxy Compound (D)]

1,3,5-Tris(4,5-epoxypentyl)isocyanurate ("TEPIC (registered trademark)"-VL (trade name) manufactured by Nissan Chemical Industries, Ltd., hereinafter referred to as "TEPIC-VL")

9,9-Bis[4-(2-glycidyloxyethoxy)phenyl]fluorene ("OGSOL EG-200 (trade name)" manufactured by Osaka Gas Chemicals Co., Ltd., hereinafter referred to as "EG-200")

9,9-Bis(4-glycidyloxyphenyl)fluorene ("OGSOL PG-100 (trade name)" manufactured by Osaka Gas Chemicals Co., Ltd., hereinafter referred to as "PG-100")

[Hindered Amine Light Stabilizer (E)]

2,2,6,6,-Tetramethyl-4-piperidine methacrylate ("ADK STAB LA-87 (trade name)" manufactured by ADEKA Corporation, hereinafter referred tows "LA-87")

[Polyfunctional Monomer]

Dipentaerythritol hexaacrylate ("KAYARAD (registered trademark)" DPHA (trade name) manufactured by Nippon Kayaku Co., Ltd., hereinafter referred to as "DPHA")

Fluorene diacrylate ("EA-0250P (trade name)" manufactured by Osaka Gas Chemicals Co., Ltd., hereinafter referred tows "EA-0250P")

Triacryl isocyanurate ("M-315 (trade name)" manufactured by Kyoeisha Chemical Co., Ltd., hereinafter referred to as "M-315")

[Silane Coupling Agent]

3-Glycidoxypropyltrimethoxysilane ("KBM-403 (trade name)" manufactured by Shin-Etsu Chemical Co., Ltd., hereinafter referred to as "KBM-403")

3-Ureidopropyltrimethoxysilane ("KBM-585 (trade name)" manufactured by Shin-Etsu Chemical Co., Ltd., hereinafter referred to as "KBM-585")

3-Ureidopropyltriethoxysilane ("KBE-585 (trade name)" manufactured by Shin-Etsu Chemical Co.; Ltd., hereinafter referred to as "KBE-585")

[Polymerization Inhibitor]

t-Butylcatechol (manufactured by Tokyo Chemical Industry Co., Ltd., hereinafter referred to as "TBC")

[Solvent]

PGMEA ("PGM-AC (trade name)" manufactured by kuraray trading Co., Ltd.)

DAA ("DAA" manufactured by Mitsubishi Chemical Corporation)

[Surfactant]

Silicone surfactant ("BYK-333 (trade name)" manufactured by BYK Japan KK, hereinafter referred to as "BYK-333")

Then, the photosensitive silver ink material used in examples and comparative examples will be described.

[Photosensitive Silver Ink Material]

Using the following photosensitive silver ink material, lamination processability with a conductive layer and migration properties under high temperature and high humidity conditions were evaluated. A method for manufacturing the photosensitive silver ink material will be described below.

First, 80.00 g of conductive fine particles (manufactured by NISSHIN ENGINEERING INC.) whose surface is coated with simple substance of carbon and/or a carbon compound, 4.06 g of DISPERBYK 21116 (manufactured by BYK Japan KK), and 196.14 g of PGMEA were mixed using a homogenizer at 1200 rpm for 30 minutes, and the liquid mixture was further dispersed using a mill disperser filled with zirconia beads to give a silver particle dispersion. To 63.28 g of the silver fine particle dispersion, a mixture of 4.40 g of the acrylic polymer (a1-2), 0.41 g of OXE-02, and 1.30 g of DPHA, and 7.31 g of PGMEA and 23.25 g of DAA were added, and the mixture was stirred to produce a photosensitive silver ink ($\alpha$).

Then, methods for producing and evaluating cured films/substrates in examples and comparative examples will be described.

<Patterning of Photosensitive Resin Composition and Production of Cured Film>

A photosensitive resin composition was applied with a spin coater ("1H-360S (trade name)" manufactured by Mikasa Co., Ltd.) to a substrate by spin coating at an arbitrary rotational speed, and the substrate was prebaked on a hot plate ("SCW-636 (trade name)" manufactured by Dainippon Screen Mfg. Co., Ltd.) at 100° C. for 2 minutes to produce a prebaked film. The prebaked film was exposed to a super high-pressure mercury lamp as a light source using a parallel light mask aligner ("PLA-501F (trade name)" manufactured by Canon Inc.) through a desired mask. Then, the prebaked film was subjected to shower development with a 0.045 wt % aqueous potassium hydroxide solution using an automatic developing apparatus ("AD-2000 (trade name)" manufactured by TAKIZAWA SANGYO K.K.) for 60 seconds, then rinsed with water for 30 seconds, and subjected to patterning.

If necessary, the patterned substrate was post-baked at 230° C. for 60 minutes (in the air) using an oven ("IHPS-222 (trade name)" manufactured by ESPEC CORP.) to produce a cured film.

<Production of Conductive Pattern of Silver Ink Material ($\alpha$)>

The silver ink material ($\alpha$) was applied with a spin coater to the substrate by spin coating at an arbitrary rotational speed, and the substrate was prebaked on a hot plate at 100° C. for 2 minutes to produce a prebaked film. The prebaked film was exposed to a super high-pressure mercury lamp as a light source using a parallel light mask aligner through a desired mask. Then, the prebaked film was subjected to shower development with a 0.045 wt % aqueous potassium hydroxide solution using an automatic developing apparatus for 60 seconds, then rinsed with water for 30 seconds, and subjected to patterning.

The patterned substrate was post-baked at 230° C. for 30 minutes (in the air) using an oven to produce a conductive film.

<Production of Laminated Substrate>

Figure 2:
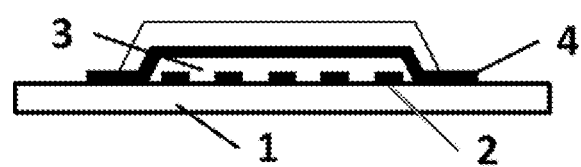
FIG. 2 is a cross-sectional view showing a configuration of the laminated substrate used for evaluation of migration properties.

Using the photosensitive resin composition and the silver ink material (α), a laminated substrate as shown in FIGS. 1 and 2 was produced. A base material 1 is a soda glass substrate (NSG soda glass; manufactured by NIPPON SHEET GLASS Co., Ltd.) or a glass substrate having $SiO_2$ deposited by sputtering on the surface thereof, conductive pattern layers 2 and 4 are conductive pattern layers made from the silver ink material (α), and insulating layers 3 and 5 are insulating layers made from the photosensitive resin composition. Each of the conductive patterns 2 and 4 include five conductive patterns of 30 μm×4 cm long each having terminals for resistance value measurement at both ends, and the insulating layers 3 and 5 are each a cured film formed by exposing the conductive patterns 2 and 4 to light with the terminal portions thereof being shielded from light. Each of the conductive pattern layers 2 and 4 and the insulating layers 3 and 5 was post-baked using an oven.

(1) Evaluation of Patternability

Patternability of the photosensitive resin composition was evaluated using an alkali-free glass substrate (OA-10; manufactured by Nippon Electric Glass Co., Ltd.). The film thickness after prebaking was 2.5 μm, and a gray scale mask for sensitivity measurement was used at the time of exposure.

After the development, the exposure amount at which 30-μm line-and-space patterns were formed at a width ratio of 1:1 (hereinafter referred to as the optimum exposure amount) was taken as the sensitivity, and the minimum pattern dimension after the development at the optimum exposure amount was taken as the resolution.

(2) Evaluation of Lamination Processability of Silver Ink Material (α)

On the cured film of the photosensitive resin composition, a conductive pattern for volume resistivity evaluation was produced using the silver ink material (α). The film thickness after prebaking was 0.6 μm, and the film was exposed to light through a photomask having a rectangular translucent pattern (10 mm×15 mm).

As for the obtained pattern for volume resistivity evaluation, the surface resistance value ρs (Ω/□) was measured with a surface resistance measuring machine ("Loresta (registered trademark)-FP" manufactured by Mitsubishi Petrochemical Co., Ltd.), and the film thickness t (cm) was measured with a surface roughness and shape measuring machine ("Surfcom (registered trademark) 1400D" manufactured by TOKYO SEIMITSU CO., LTD.). The two values were multiplied to calculate the volume resistivity (μΩ·cm). The volume resistivity is preferably less than 150 μΩ·cm, more preferably less than 100 μΩ·cm, still more preferably less than 60 μΩ·cm.

Further, as for the unexposed portion of the substrate having the pattern for volume resistivity evaluation formed thereon, the residue on the substrate was evaluated by evaluating the transmittance. Specifically, as for the unexposed portion, the transmittance at 400 nm before and after film formation was measured with an ultraviolet-visible spectrophotometer ("MultiSpec-1500 (trade name)" manufactured by Shimadzu Corporation). Then, the change in transmittance expressed by the formula (T0−T)/T0 was calculated, wherein the transmittance before film formation is T0, and the transmittance after film formation is T. A change in transmittance less than 1% was judged as "S", less than 2% was judged as "A", less than 3% was judged as "B", and 3% or more was judged as "C". The judgment result was preferably "B", more preferably "A", still more preferably "S" as the degree of generation of residue.

(3) Evaluation of Cured Film Properties

Using a laminated substrate obtained by performing the procedure of <Production of laminated substrate> described above up to the formation of the insulating layer 3 on the glass substrate having $SiO_2$ deposited by sputtering on the surface thereof, the light transmittance and the surface roughness (Ra) of the laminated substrate were measured.

First, only the base material 1 was subjected to the measurement with an ultraviolet-visible spectrophotometer, and the ultraviolet-visible absorption spectrum thereof was used as a reference. Then, the flat film portion of the insulating layer 3 of the laminated substrate was measured by a single-beam method to determine the light transmittance per 1.0 μm at a wavelength of 400 nm, and the difference from the reference was taken as the light transmittance of the cured film. The light transmittance is preferably 85% or more, more preferably 90% or more, still more preferably 95% or more.

Further, the surface roughness (Ra) of the laminated portion of the conductive pattern 2/the insulating layer 3 was measured at four positions in the substrate using the surface roughness and shape measuring machine. An average of Ra less than 100 angstroms was judged as "S", less than 200 angstroms was judged as "A", less than 500 angstroms was judged as "B", and 500 angstroms or more was judged as "C". The judgment result was preferably "B", more preferably "A", still more preferably "S" as the degree of surface roughness.

(4) Evaluation of Moisture and Heat Resistance

Using the produced laminated substrate, the migration properties were evaluated. For the measurement, an insulation deterioration characteristic evaluation system "ETAC SIR13" (manufactured by Kusumoto Chemicals, Ltd.) was used. An electrode was attached to each of the terminal portions of the conductive patterns 2 and 4, and the sample was placed in a high-temperature and high-humidity chamber set to the conditions of 85° C. and 85% RH. A voltage was applied between the electrodes of the conductive patterns 2 and 4 after 5 minutes from the stabilization of the environment inside the chamber, and the temporal change of the insulation resistance was measured. In the measurement, a voltage of 10 V was applied using the conductive pattern 2 as a positive electrode and the conductive pattern 4 as a negative electrode, and the resistance value over 500 hours was measured at intervals of 5 minutes. When the measured resistance value reached 10 to the fifth power or less, it was judged that short circuit occurred due to insulation failure, and the application of the voltage was stopped. The test period up to then was taken as the short circuit duration. The short circuit duration is preferably 100 hours or more, more preferably 300 hours or more as the degree of migration properties.

Further, using the laminated substrate taken out after 500 hours under the conditions of 85° C. and 85% RH in the high-temperature and high-humidity chamber, the adhesion between the base material 1 and the cured film was evaluated according to JIS "K 5600-5-6 (date of establishment: Apr. 20, 1999)".

On the surface of the cured film formed on the substrate, two sets, which were perpendicular to each other, of 11 parallel straight lines were inscribed with a cutter knife at an interval of 1 mm in such a manner that the lines reached the base of the glass plate to produce 100 squares each having a size of 1 mm×1 mm. A piece of cellophane adhesive tape (width: 18 mm, adhesive force: 3.7 N/10 mm) was stuck to the inscribed surface of the cured film, and the tape was brought into close contact with the cured film by rubbing with an eraser (JIS 5.6050 accepted product). Then, one end of the tape was held and the tape was peeled off instantaneously in a direction perpendicular to the substrate, and the number of squares remaining on the substrate was visually counted. The adhesion was rated according to the following criteria of the area of peeled squares. Grade 4 or higher was regarded as acceptable.
  5: Area of peeled squares is 0%
  4: Area of peeled squares is 1 to 4%
  3: Area of peeled squares is 5 to 14%
  2: Area of peeled squares is 15 to 34%
  1: Area of peeled squares is 35% to 64%
  0: Area of peeled squares is 65% to 100%

Example 1

Under a yellow light, 0.25 g of OXE-02 as a photopolymerization initiator (B), 0.50 g of LA-87 as a hindered amine light stabilizer (E), and 0.50 g of TBC as a polymerization inhibitor in the form of a 10 wt % PGMEA solution were dissolved in 14.19 g of PGMEA and 30.00 g of DAA as solvents, 0.30 g (corresponding to a concentration of 300 ppm) of BYK-333 as a surfactant in the form of a 10 wt % PGMEA solution was added thereto, and the mixture was stirred. To the mixture, 6.49 g of TEPIC-VL in the form of a 50 wt % PGMEA solution and 12.49 g of EG-200 in the form of a 20 wt % PGMEA solution both as polyfunctional epoxy compounds (D), 6.19 g of DPHA as a polyfunctional monomer, 9.36 g of a 40 wt % solution (a1-1) of an acrylic polymer (A1), 18.73 g of a 40 wt % solution (a2-1) of a cardo based resin (A2), and 1.00 g of KBM-403 as a silane coupling agent (F) were added, and the mixture was stirred. Then, the mixture was filtered with a 0.45 μm filter to give a photosensitive resin composition. The obtained photosensitive resin composition was evaluated for (1) patternability, (2) lamination processability of silver ink material (α), (3) cured film properties, and (4) moisture and heat resistance. The composition and results are shown in Tables 1 and 2.

Examples 2 to 18

Photosensitive resin compositions having the compositions shown in Tables 1 and 2 were obtained in the same manner as in Example 1, and the photosensitive resin compositions were evaluated in the same manner as in Example 1. The evaluation results are shown in Tables 4 and 5.

Example 19

Under a yellow light, 0.25 g of PBG-305 as a photopolymerization initiator (B), 0.50 g of LA-87 as a hindered amine light stabilizer (E), and 0.50 g of TBC as a polymerization inhibitor in the form of a 10 wt % PGMEA solution were dissolved in 2.24 g of PGMEA and 30.00 g of DAA as solvents, 0.30 g (corresponding to a concentration of 300 ppm) of BYK-333 as a surfactant in the form of a 10 wt % PGMEA solution was added thereto, and the mixture was stirred. To the mixture, 4.25 g of TAIC as a polyfunctional allyl compound (C), 24.50 g of PG-100 as a polyfunctional epoxy compound (D) in the form of a 10 wt % PGMEA solution, 1.25 g of EA-0250P. and 2.75-g of M-315 as polyfunctional monomers, 3.12 g of a 40 wt % solution (a1-5) of an acrylic polymer (A1), 29.34 g of a 40 wt % solution (a2-1) of a cardo based resin (A2), and 1.00 g of KBM-403 as a silane coupling agent (F) were added, and the mixture was stirred. Then, the mixture was filtered with a 0.45 filter to give a photosensitive resin composition. The obtained photosensitive resin composition was evaluated for (1) patternability, (2) lamination processability of silver ink material (α), (3) cured film properties, and (4) moisture and heat resistance. The composition and results are shown in Tables 3 and 6.

Examples 20 to 24 and Comparative Examples 1 to 3

Photosensitive resin compositions having the compositions shown in Table 3 were obtained in the same manner as in Example 19, and the photosensitive resin compositions were evaluated in the same manner as in Example 19. The evaluation results are shown in Table 6.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Acrylic polymer (A1) | (a1-1) | 9.36 | 2.65 | 21.85 | 24.97 | — | — | — | — | 9.36 |
| *(a1'-1) is | (a1-2) | — | — | — | — | 9.36 | — | — | — | — |
| polysiloxane | (a1-3) | — | — | — | — | — | 9.36 | — | — | — |
| | (a1-4) | — | — | — | — | — | — | 9.36 | — | — |
| | (a1-5) | — | — | — | — | — | — | — | 9.36 | — |
| | (a1-6) | — | — | — | — | — | — | — | — | — |
| | (a1'-1) | — | — | — | — | — | — | — | — | — |
| Cardo based resin (A2) | (a2-1) | 18.73 | 25.44 | 6.24 | 3.12 | 18.73 | 18.73 | 18.73 | 18.73 | — |
| | (a2-2) | — | — | — | — | — | — | — | — | 18.73 |
| Photopolymerization initiator (B) | OXE-02 | 0.25 | 0.25 | 0.25 | 0.25 | 0.25 | 0.25 | 0.25 | 0.25 | 0.25 |
| | OXE-01 | — | — | — | — | — | — | — | — | — |
| | PBG-305 | — | — | — | — | — | — | — | — | — |
| Polyfunctional allyl compound (C) | TAIC | — | — | — | — | — | — | — | — | — |
| Polyfunctional epoxy compound (D) | TEPIC-VL 50 wt % PGMEA solution | 6.49 | 6.49 | 6.49 | 6.49 | 6.49 | 6.49 | 6.49 | 6.49 | 6.49 |
| | EG-200 20 wt % PGMEA solution | 12.49 | 12.49 | 12.49 | 12.49 | 12.49 | 12.49 | 12.49 | 12.49 | 12.49 |
| | PG-100 10 wt % PGMEA solution | — | — | — | — | — | — | — | — | — |

TABLE 1-continued

|  |  | Example 1 | Example 2 | Example 3 | Example 4 | Example 5 | Example 6 | Example 7 | Example 8 | Example 9 |
|---|---|---|---|---|---|---|---|---|---|---|
| Hindered amine light stabilizer (E) | LA-87 | 0.50 | 0.50 | 0.50 | 0.50 | 0.50 | 0.50 | 0.50 | 0.50 | 0.50 |
| Silane coupling agent (F) | KBM-403 | 1.00 | 1.00 | 1.00 | 1.00 | 1.00 | 1.00 | 1.00 | 1.00 | 1.00 |
|  | KBM-585 | — | — | — | — | — | — | — | — | — |
|  | KBE-585 | — | — | — | — | — | — | — | — | — |
| Polyfunctional monomer | DPHA | 6.19 | 6.19 | 6.19 | 6.19 | 6.19 | 6.19 | 6.19 | 6.19 | 6.19 |
|  | EA-0250P | — | — | — | — | — | — | — | — | — |
|  | M-315 | — | — | — | — | — | — | — | — | — |
| Polymerization inhibitor | TBC | 0.50 | 0.50 | 0.50 | 0.50 | 0.50 | 0.50 | 0.50 | 0.50 | 0.50 |
| Surfactant | BYK-333 | 0.30 | 0.30 | 0.30 | 0.30 | 0.30 | 0.30 | 0.30 | 0.30 | 0.30 |
| Solvent | PGMEA | 14.19 | 14.19 | 14.19 | 14.19 | 14.19 | 14.19 | 12.31 | 14.19 | 14.19 |
|  | DAA | 30.00 | 30.00 | 30.00 | 30.00 | 30.00 | 30.00 | 22.50 | 30.00 | 30.00 |
|  | DPM | — | — | — | — | — | — | 9.38 | — | — |
| Solid content concentration |  | 25% | 25% | 25% | 25% | 25% | 25% | 25% | 25% | 25% |

TABLE 2

|  |  | Example 10 | Example 11 | Example 12 | Example 13 | Example 14 | Example 15 | Example 16 | Example 17 | Example 18 |
|---|---|---|---|---|---|---|---|---|---|---|
| Acrylic polymer (A1) | (a1-1) | 9.36 | 9.36 | 9.36 | 9.36 | 9.36 | — | 9.36 | 9.36 | — |
| *(a1'-1) is polysiloxane | (a1-2) | — | — | — | — | — | — | — | — | 9.36 |
|  | (a1-3) | — | — | — | — | — | — | — | — | — |
|  | (a1-4) | — | — | — | — | — | 9.36 | — | — | — |
|  | (a1-5) | — | — | — | — | — | — | — | — | — |
|  | (a1-6) | — | — | — | — | — | — | — | — | — |
|  | (a1'-1) | — | — | — | — | — | — | — | — | — |
| Cardo based resin (A2) | (a2-1) | 18.73 | 18.73 | 18.73 | 18.73 | 18.73 | 18.73 | 18.73 | 18.73 | 18.73 |
|  | (a2-2) | — | — | — | — | — | — | — | — | — |
| Photopolymerization initiator (B) | OXE-02 | 0.25 | 0.25 | 0.25 | 0.25 | 0.25 | 0.25 | — | — | — |
|  | OXE-01 | — | — | — | — | — | — | 0.25 | — | 0.25 |
|  | PBG-305 | — | — | — | — | — | — | — | 0.25 | — |
| Polyfunctional allyl compound (C) | TAIC | — | — | — | — | — | — | — | — | — |
| Polyfunctional epoxy compound (D) | TEPIC-VL 50 wt % PGMEA solution | 6.49 | 6.49 | — | — | 6.49 | 6.49 | 7.50 | 7.50 | 7.50 |
|  | EG-200 20 wt % PGMEA solution | — | — | 12.49 | — | 12.49 | 12.49 | — | — | — |
|  | PG-100 10 wt % PGMEA solution | — | — | — | 24.97 | — | — | — | — | — |
| Hindered amine light stabilizer (E) | LA-87 | 0.50 | 0.50 | 0.50 | 0.50 | — | — | 0.50 | 0.50 | 0.50 |
| Silane coupling agent (F) | KBM-403 | 1.00 | 1.00 | 1.00 | 1.00 | 1.00 | 1.00 | 1.00 | 1.00 | 1.00 |
|  | KBM-585 | — | — | — | — | — | — | — | — | — |
|  | KBE-585 | — | — | — | — | — | — | — | — | — |
| Polyfunctional monomer | DPHA | 6.19 | 8.69 | 9.44 | 11.94 | 6.69 | 6.69 | 2.50 | 2.50 | 2.50 |
|  | EA-0250P | — | — | — | — | — | — | 3.75 | 3.75 | 3.75 |
|  | M-315 | — | — | — | — | — | — | 1.83 | 1.83 | 1.83 |
| Polymerization inhibitor | TBC | 0.50 | 0.50 | 0.50 | 0.50 | 0.50 | 0.50 | 0.50 | 0.50 | 0.50 |
| Surfactant | BYK-333 | 0.30 | 0.30 | 0.30 | 0.30 | 0.30 | 0.30 | 0.30 | 0.30 | 0.30 |
| Solvent | PGMEA | 1.71 | 24.18 | 17.44 | 27.43 | 14.19 | 12.31 | 23.78 | 23.78 | 23.78 |
|  | DAA | 30.00 | 30.00 | 30.00 | 30.00 | 30.00 | 22.50 | 30.00 | 30.00 | 30.00 |
|  | DPM | — | — | — | — | — | 9.38 | — | — | — |
| Solid content concentration |  | 25% | 25% | 25% | 25% | 25% | 25% | 25% | 25% | 25% |

TABLE 3

|  |  | Example 19 | Example 20 | Example 21 | Example 22 | Example 23 | Example 24 | Comparative Example 1 | Comparative Example 2 | Comparative Example 3 |
|---|---|---|---|---|---|---|---|---|---|---|
| Acrylic polymer (A1) | (a1-1) | — | — | — | — | — | — | — | 28.09 | — |
| *(a1'-1) is polysiloxane | (a1-2) | — | — | — | — | — | — | — | — | — |
|  | (a1-3) | — | — | — | — | — | — | — | — | — |
|  | (a1-4) | — | — | — | — | — | — | — | — | — |

TABLE 3-continued

|  |  | Example 19 | Example 20 | Example 21 | Example 22 | Example 23 | Example 24 | Comparative Example 1 | Comparative Example 2 | Comparative Example 3 |
|---|---|---|---|---|---|---|---|---|---|---|
|  | (a1-5) | — | — | — | — | — | — | — | — | — |
|  | (a1-6) | 3.12 | 3.12 | 3.12 | 3.12 | 3.12 | 3.12 | — | — | — |
|  | (a1'-1) | — | — | — | — | — | — | — | — | 9.36 |
| Cardo based resin (A2) | (a2-1) | 29.34 | 29.34 | 28.34 | 28.34 | 29.34 | 29.34 | 28.09 | — | 18.73 |
|  | (a2-2) | — | — | — | — | — | — | — | — | — |
| Photopolymerization initiator (B) | OXE-02 | — | — | — | — | — | — | 0.25 | 0.25 | 0.25 |
|  | OXE-01 | — | 0.25 | — | — | — | — | — | — | — |
|  | PBG-305 | 0.25 | — | 0.25 | 0.25 | 0.25 | 0.25 | — | — | — |
| Polyfunctional allyl compound (C) | TAIC | 4.25 | 4.25 | 4.25 | 4.25 | 4.25 | 4.25 | — | — | — |
| Polyfunctional epoxy compound (D) | TEPIC-VL 50 wt % PGMEA solution | — | — | — | — | — | — | 6.49 | 6.49 | 6.49 |
|  | EG-200 20 wt % PGMEA solution | — | — | — | — | — | — | 12.49 | 12.49 | 12.49 |
|  | PG-100 10 wt % PGMEA solution | 24.50 | 24.50 | 24.50 | 24.50 | 24.50 | 24.50 | — | — | — |
| Hindered amine light stabilizer (E) | LA-87 | 0.50 | 0.50 | 0.50 | 0.50 | 0.50 | 0.50 | 0.50 | 0.50 | 0.50 |
| Silane coupling agent (F) | KBM-403 | 1.00 | 1.00 | 1.00 | 1.00 | — | — | 1.00 | 1.00 | 1.00 |
|  | KBM-585 | — | — | 1.00 | — | 1.00 | — | — | — | — |
|  | KBE-585 | — | — | — | 1.00 | — | 1.00 | — | — | — |
| Polyfunctional monomer | DPHA | — | — | — | — | — | — | 6.19 | 6.19 | 6.19 |
|  | EA-0250P | 1.25 | 1.25 | 1.25 | 1.25 | 1.25 | 1.25 | — | — | — |
|  | M-315 | 2.75 | 2.75 | 2.75 | 2.75 | 2.75 | 2.75 | — | — | — |
| Polymerization inhibitor | TBC | 0.50 | 0.50 | 0.50 | 0.50 | 0.50 | 0.50 | 0.50 | 0.50 | 0.50 |
| Surfactant | BYK-333 | 0.30 | 0.30 | 0.30 | 0.30 | 0.30 | 0.30 | 0.30 | 0.30 | 0.30 |
| Solvent | PGMEA | 2.24 | 2.24 | 2.24 | 2.24 | 2.24 | 2.24 | 14.19 | 14.19 | 14.19 |
|  | DAA | 30.00 | 30.00 | 30.00 | 30.00 | 30.00 | 30.00 | 30.00 | 30.00 | 30.00 |
|  | DPM | — | — | — | — | — | — | — | — | — |
| Solid content concentration |  | 25% | 25% | 25% | 25% | 25% | 25% | 25% | 25% | 25% |

TABLE 4

|  |  | Example 1 | Example 2 | Example 3 | Example 4 | Example 5 |
|---|---|---|---|---|---|---|
| Weight average molecular weight [Mw] | Acrylic polymer (A1) | 13,500 | 13,500 | 13,500 | 13,500 | 17,000 |
|  | Cardo based resin (A2) | 3,500 | 3,500 | 3,500 | 3,500 | 3,500 |
|  | Mw (A2)/Mw (A1) | 0.259 | 0.259 | 0.259 | 0.259 | 0.206 |
| (1) Patternability | Sensitivity [mJ/cm$^2$] | 70 | 100 | 70 | 70 | 70 |
|  | Resolution [μm] | 15 | 20 | 15 | 15 | 15 |
| (2) Lamination processability | Volume resistivity [μΩ · cm] | 80 | 75 | 80 | 90 | 80 |
|  | Residue | S | S | A | B | A |
| (3) Cured film properties | Transmittance [% T/μm] | 95.2 | 96.0 | 94.8 | 91.0 | 95.5 |
|  | Surface roughness | S | S | A | B | S |
| (4) Moisture and heat resistance | Migration properties | >200 h | >100 h | >300 h | >300 h | >200 h |
|  | Adhesiveness | 5 | 4 | 5 | 5 | 5 |

|  |  | Example 6 | Example 7 | Example 8 | Example 9 |
|---|---|---|---|---|---|
| Weight average molecular weight [Mw] | Acrylic polymer (A1) | 12,000 | 22,000 | 29,000 | 13,500 |
|  | Cardo based resin (A2) | 3,500 | 3,500 | 3,500 | 5,500 |
|  | Mw (A2)/Mw (A1) | 0.292 | 0.159 | 0.121 | 0.407 |
| (1) Patternability | Sensitivity [mJ/cm$^2$] | 70 | 100 | 100 | 70 |
|  | Resolution [μm] | 20 | 20 | 20 | 100 |
| (2) Lamination processability | Volume resistivity [μΩ · cm] | 100 | 50 | 100 | 100 |
|  | Residue | A | A | A | A |
| (3) Cured film properties | Transmittance [% T/μm] | 93.6 | 91.7 | 92.5 | 94.4 |
|  | Surface roughness | A | A | A | A |

TABLE 4-continued

|  |  |  |  |  |  |
|---|---|---|---|---|---|
| (4) Moisture and heat resistance | Migration properties | >100 h | >100 h | >100 h | >100 h |
|  | Adhesiveness | 5 | 4 | 5 | 5 |

TABLE 5

|  |  | Example 10 | Example 11 | Example 12 | Example 13 | Example 14 |
|---|---|---|---|---|---|---|
| Weight average molecular weight [Mw] | Acrylic polymer (A1) | 13,500 | 13,500 | 13,500 | 13,500 | 13,500 |
|  | Cardo based resin (A2) | 3,500 | 3,500 | 3,500 | 3,500 | 3,500 |
|  | Mw (A2)/Mw (A1) | 0.259 | 0.259 | 0.259 | 0.259 | 0.259 |
| (1) Patternability | Sensitivity [mJ/cm$^2$] | 50 | 70 | 70 | 100 | 70 |
|  | Resolution [μm] | 100 | 20 | 30 | 20 | 15 |
| (2) Lamination processability | Volume resistivity [μΩ · cm] | 90 | 100 | 80 | 90 | 80 |
|  | Residue | A | A | A | A | A |
| (3) Cured film properties | Transmittance [% T/μm] | 94.5 | 93.8 | 94.9 | 95.1 | 89.9 |
|  | Surface roughness | S | B | B | B | A |
| (4) Moisture and heat resistance | Migration properties | >200 h | >100 h | >100 h | >100 h | >200 h |
|  | Adhesiveness | 4 | 5 | 5 | 5 | 5 |

|  |  | Example 15 | Example 16 | Example 17 | Example 18 |
|---|---|---|---|---|---|
| Weight average molecular weight [Mw] | Acrylic polymer (A1) | 22000 | 13,500 | 13,500 | 17,000 |
|  | Cardo based resin (A2) | 3,500 | 3,500 | 3,500 | 3,500 |
|  | Mw (A2)/Mw (A1) | 0.159 | 0.259 | 0.259 | 0.206 |
| (1) Patternability | Sensitivity [mJ/cm$^2$] | 100 | 70 | 50 | 70 |
|  | Resolution [μm] | 15 | 20 | 15 | 20 |
| (2) Lamination processability | Volume resistivity [μΩ · cm] | 50 | 80 | 70 | 75 |
|  | Residue | A | A | A | A |
| (3) Cured film properties | Transmittance [% T/μm] | 86.3 | 94.8 | 95.5 | 95.2 |
|  | Surface roughness | A | A | S | A |
| (4) Moisture and heat resistance | Migration properties | >100 h | >300 h | >300 h | >200 h |
|  | Adhesiveness | 4 | 5 | 5 | 5 |

TABLE 6

|  |  | Example 19 | Example 20 | Example 21 | Example 22 | Example 23 |
|---|---|---|---|---|---|---|
| Weight average molecular weight [Mw] | Acrylic polymer (A1) | 20,000 | 20,000 | 20,000 | 20,000 | 20,000 |
|  | Cardo based resin (A2) | 3,500 | 3,500 | 3,500 | 3,500 | 3,500 |
|  | Mw (A2)/Mw (A1) | 0.175 | 0.175 | 0.175 | 0.175 | 0.175 |
| (1) Patternability | Sensitivity [mJ/cm$^2$] | 50 | 70 | 70 | 50 | 50 |
|  | Resolution [μm] | 15 | 20 | 20 | 30 | 20 |
| (2) Lamination processability | Volume resistivity [μΩ · cm] | 50 | 60 | 70 | 55 | 60 |
|  | Residue | S | S | S | S | S |
| (3) Cured film properties | Transmittance [% T/μm] | 97.8 | 97.2 | 96.8 | 97.1 | 97.4 |
|  | Surface roughness | S | A | S | S | A |

TABLE 6-continued

| (4) Moisture and heat resistance | Migration properties | >300 h | >200 h | >200 h | >300 h | >200 h |
|---|---|---|---|---|---|---|
| | Adhesiveness | 5 | 5 | 5 | 5 | 5 |

| | | Example 24 | Comparative Example 1 | Comparative Example 2 | Comparative Example 3 |
|---|---|---|---|---|---|
| Weight average molecular weight [Mw] | Acrylic polymer (A1) | 20,000 | — | — | — |
| | Cardo based resin (A2) | 3,500 | 3,500 | — | 3,500 |
| | Mw (A2)/Mw (A1) | 0.175 | — | — | — |
| (1) Patternability | Sensitivity [mJ/cm$^2$] | 70 | 100 | 50 | 50 |
| | Resolution [μm] | 20 | 20 | 15 | 10 |
| (2) Lamination processability | Volume resistivity [μΩ·cm] | 70 | 60 | 100 | >500 |
| | Residue | S | A | C | C |
| (3) Cured film properties | Transmittance [% T/μm] | 96.8 | 96.6 | 90.9 | 97.1 |
| | Surface roughness | S | A | C | A |
| (4) Moisture and heat resistance | Migration properties | >200 h | <1 h | >200 h | 6 h |
| | Adhesiveness | 5 | 0 | 5 | 1 |

INDUSTRIAL APPLICABILITY

Applications of a cured film obtained by curing the photosensitive resin composition of the present invention are not particularly limited, and the cured film is suitably used as various protective films such as protective films for touch panels, various hard coat materials, flattening films for TFTs, overcoats for color filters, antireflection films, and passivation films, optical filters, insulating films for touch panels, insulating films for TFTs, photo spacers for color filters, and the like.

DESCRIPTION OF REFERENCE SIGNS

1: Base material
2: Conductive pattern
3: Insulating layer
4: Conductive pattern
5: Insulating layer

The invention claimed is:

1. A photosensitive resin composition comprising:
    an acrylic polymer (A1) having, in a side chain thereof, a polymerizable group,
    a cardo based resin (A2) having a polymerizable group and an alkali-soluble group,
    a photopolymerization initiator (B), and
    a polyfunctional epoxy compound (d2) having four or more aromatic rings and having quaternary carbon that has three or more bonds with the aromatic rings,
    wherein contents of the acrylic polymer (A1) and the cardo based resin (A2) satisfy a weight ratio of 1:10 to 10:1.

2. The photosensitive resin composition according to claim 1, wherein the acrylic polymer (A1) has an alicyclic skeleton in a side chain thereof.

3. The photosensitive resin composition according to claim 2, wherein the alicyclic skeleton has a polycyclic structure.

4. The photosensitive resin composition according to claim 1, wherein a weight average molecular weight Mw(A1) of the acrylic polymer (A1) and a weight average molecular weight Mw(A2) of the cardo based resin (A2) satisfy the following formula:

$$0.14 \leq Mw(A2)/Mw(A1) \leq 1.00.$$

5. A cured film that is a cured product of the photosensitive resin composition according to claim 1.

6. A laminate comprising one or more conductive layers and a cured film that is a cured product of a photosensitive resin composition comprising:
    an acrylic polymer (A1) having, in a side chain thereof, a polymerizable group,
    a cardo based resin (A2) having a polymerizable group and an alkali-soluble group, and
    a photopolymerization initiator (B),
    wherein contents of the acrylic polymer (A1) and the cardo based resin (A2) satisfy a weight ratio of 1:10 to 10:1, and
    wherein the cured film has a transmittance of 85% or more at a thickness of 2.0 μm.

7. A laminate comprising one or more conductive layers and the cured film according to claim 5 between a plurality of conductive layers.

8. The laminate according to claim 6, wherein at least one of the conductive layers contains silver.

9. The laminate according to claim 8, wherein the silver contained in the at least one conductive layer has a primary particle diameter of 10 to 200 nm.

10. The laminate according to claim 6, wherein the conductive layers contain an organic component having at least an alkali-soluble group in an amount of 5 to 35 wt %.

11. The photosensitive resin composition according to claim 1, further comprising a polyfunctional allyl compound (C).

12. The photosensitive resin composition according to claim 11, wherein the polyfunctional allyl compound (C) has an isocyanurate skeleton.

13. The photosensitive resin composition according to claim 1, further comprising a hindered amine light stabilizer (E).

14. The photosensitive resin composition according to claim 13, wherein the hindered amine light stabilizer (E) has an unsaturated double bond.

15. The photosensitive resin composition according to claim 1, further comprising a silane coupling agent (F).

16. The photosensitive resin composition according to claim 15, wherein the silane coupling agent (F) contains nitrogen.

17. A touch panel member, comprising the laminate according to claim 6.

18. A method for manufacturing a cured film, comprising at least the steps of: applying the photosensitive resin composition according to claim 1 to give a coating film, and heating the coating film at 200 to 250° C.

* * * * *